(12) United States Patent
Lou

(10) Patent No.: US 12,163,980 B2
(45) Date of Patent: Dec. 10, 2024

(54) PROBE AND ELASTIC STRUCTURE THEREOF

(71) Applicant: TECAT TECHNOLOGIES (SUZHOU) LIMITED, Suzhou (CN)

(72) Inventor: Choon Leong Lou, Singapore (SG)

(73) Assignee: TECAT TECHNOLOGIES (SUZHOU) LIMITED, Suzhou (CN)

( * ) Notice: Subject to any disclaimer, the term of this patent is extended or adjusted under 35 U.S.C. 154(b) by 0 days.

(21) Appl. No.: 17/889,034

(22) Filed: Aug. 16, 2022

(65) Prior Publication Data

US 2023/0314473 A1 Oct. 5, 2023

(30) Foreign Application Priority Data

Mar. 29, 2022 (TW) .................................. 111111987

(51) Int. Cl.
*G01R 1/067* (2006.01)

(52) U.S. Cl.
CPC ....... *G01R 1/06716* (2013.01); *G01R 1/0675* (2013.01)

(58) Field of Classification Search
CPC .......................... G01R 1/06716; G01R 1/0675
See application file for complete search history.

(56) References Cited

U.S. PATENT DOCUMENTS

| | | | |
|---|---|---|---|
| 6,945,827 B2 | 9/2005 | Grube et al. | |
| 9,702,904 B2 | 7/2017 | Breinlinger et al. | |
| 10,578,646 B2 * | 3/2020 | Acconcia | G01R 1/06733 |
| 2007/0270041 A1 * | 11/2007 | Grube | G01R 1/06733 439/660 |
| 2008/0211524 A1 * | 9/2008 | Chen | C25D 1/00 324/755.01 |
| 2010/0207654 A1 * | 8/2010 | Hsu | G01R 1/06716 430/319 |
| 2011/0241715 A1 * | 10/2011 | Huang | G01R 1/06772 324/755.05 |
| 2019/0170817 A1 * | 6/2019 | Uebayashi | G01R 1/07357 |
| 2020/0049761 A1 * | 2/2020 | Liu | G01R 1/06716 |
| 2020/0233014 A1 | 7/2020 | Lee et al. | |

(Continued)

FOREIGN PATENT DOCUMENTS

| | | | | |
|---|---|---|---|---|
| CN | 107615077 A | * | 1/2018 | ............. G01R 1/067 |
| CN | 211528494 U | | 9/2020 | |
| CN | 212364377 U | | 1/2021 | |

(Continued)

OTHER PUBLICATIONS

CN-107615077-A, Kondo M, (Year: 2018).*

(Continued)

*Primary Examiner* — Paresh Patel
(74) *Attorney, Agent, or Firm* — MUNCY, GEISSLER, OLDS & LOWE, P.C.

(57) ABSTRACT

The present disclosure provides a probe and an elastic structure thereof. The probe includes: a first end portion, a second end portion and a plurality of elastic units. The elastic units are disposed between the first end portion and the second portion. Each elastic unit includes a first supporting element and a second supporting element, wherein the first supporting element and the second supporting element are at opposite sides of an axis, and the axis extends along a length of the probe.

15 Claims, 22 Drawing Sheets

(56) References Cited

U.S. PATENT DOCUMENTS

2021/0302471 A1* 9/2021 Ahn .................. G01R 1/06794
2023/0194570 A1* 6/2023 Lou .................... G01R 1/07314
                                                                324/754.07

FOREIGN PATENT DOCUMENTS

| EP | 1160576 A2 * | 12/2001 | ......... G01R 1/06716 |
|----|--------------|---------|------------------------|
| JP | 2010-188516 A | 9/2010 | |
| JP | 2015-76325 A | 4/2015 | |
| JP | 2017-59363 A | 3/2017 | |
| WO | WO2022/249954 | 12/2022 | |

OTHER PUBLICATIONS

EP-1160576-A2, Haga T. (Year: 2001).*
Office Action of TW Application No. 111111987 and English translation, dated Jun. 27, 2023, 11 pages.

* cited by examiner

PROBE AND ELASTIC STRUCTURE THEREOF

CROSS REFERENCE TO RELATED APPLICATION

This application claims priority of Taiwan application No. 111111987 filed on Mar. 29, 2022, which is incorporated by reference in its entirety.

TECHNICAL FIELD

The present disclosure relates to a probe, and more particularly, to a probe and an elastic structure thereof.

DISCUSSION OF THE BACKGROUND

In the prior art, a three-piece elastic pin (for example, a pogo pin) is one common structure of a probe, and primarily consists of a plunger, a tube and a spring. In the three-piece elastic pin, the spring is generally arranged in the tube. However, such structure suffers from various drawbacks. For example, (1) the arrangement of the spring results in a physical limitation in potential reduction of a volume of the probe; (2) the spring provided inside the elastic pin significantly constrains an effective area that the elastic pin can provide for flowing of a current; (3) elastic forces of top and bottom contact points of the elastic pin are substantially equal, leading to an overly large or insufficient pressure during contacting of a device under test or a test carrier board and hence affecting a flow path of the current; (4) the spring is susceptible to receiving non-uniform force distribution, such that the probe may become skewed, thereby causing poor signal transmission; and (5) a parasitic capacitance value or a resistance value can easily increase along with the foregoing issues, resulting in inaccuracy and unreliability in testing applications of high-frequency circuits.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

A probe provided according to an embodiment of the present disclosure includes a first end portion, a second end portion and a plurality of elastic units. The elastic units are disposed between the first end portion and the second end portion. Each elastic unit includes a first support element and a second support element. The first support element and the second support element are arranged in a mirrored configuration on opposite sides of an axis, wherein the axis is a centerline of the probe and extends along a length of the probe.

In some embodiments, neither of the first support element and the second support element intersects the axis.

In some embodiments, the two end portions of the probe have a maximum width, and a length of a line segment between the first support element and the second support element and perpendicular to the axis is less than or equal to the maximum width.

In some embodiments, when the two end portions of the probe are compressed, each of the first support element and the second support element is deformed, and the deformed first support element and the deformed second support element do not come into contact with each other.

In some embodiments, the first support element and the second support element are deformed in a direction toward the axis.

In some embodiments, the first support element and the second support element are deformed in a direction away from the axis, and a length of a longest line segment between the deformed first support element and the deformed second support element and perpendicular to the axis is less than or equal to the maximum width.

In some embodiments, the elastic units, a plurality of connecting units, the first end portion and the second end portion are formed as an integral unit.

In some embodiments, when the probe is subjected to a lateral force of at least one guide plate, at least a part of the probe is displaced from the axis.

In some embodiments, the at least a part of the probe includes the first end portion, the second end portion, at least one of the elastic units or at least one of the connecting units.

An elastic structure of a probe provided according to another embodiment of the present disclosure includes a first section, a second section, a connecting unit, a first elastic unit and a second elastic unit. The first elastic unit is connected to the connecting unit, extends in a first direction from the connecting unit, and is connected to the first section. The first elastic unit includes a first support portion and a second support portion, and is for connecting the connecting unit to the first section. The second elastic unit is connected to the connecting unit, extends in a second direction from the connecting unit, and is connected to the second section. The second elastic unit includes a third support portion and a fourth support portion, and is for connecting the connecting unit to the second section. The first support portion and the second support portion are on opposite sides of an axis, the third support portion and the fourth support portion are on opposite sides of the axis, and the axis extends along the length of the probe.

In some embodiments, when the probe is subjected to a force and is compressed, the first support portion, the second support portion, the third support portion and the fourth support portion are deformed. A length of a line segment formed between any point of the deformed first support portion and any point of the deformed second support portion and perpendicular to the first direction is less than or equal to a maximum width of the first section and the second section, and a length of a line segment formed between any point of the deformed third support portion and any point of the deformed fourth support portion and perpendicular to the second direction is less than or equal to the maximum width of the first section and the second section.

In some embodiments, the first section, the second section, the connecting unit, the first support portion, the second support portion, the third support portion and the fourth support portion are formed as an integral unit.

In some embodiments, a length of a line segment formed between any point of the first support portion and any point of the second support portion and perpendicular to the first direction is less than or equal to the maximum width of the first section and the second section. In some embodiments, a length of a line segment formed between any point of the third support portion and any point of the fourth support portion and perpendicular to the second direction is less than or equal to the maximum width of the first section and the second section.

In some embodiments, the axis is a centerline of the probe.

In some embodiments, the first support portion and the second support portion are arranged in a mirrored configuration on opposite sides of the axis, and the third support portion and the fourth support portion are arranged in a mirrored configuration on opposite sides of the axis.

In some embodiments, the first support portion and the third support portion are arranged in a mirrored configuration on opposite sides of the connecting unit, and the second support portion and the fourth support portion are arranged in a mirrored configuration on opposite sides of the connecting unit.

The technical features and advantages of the present disclosure are comprehensively provided in the description above, so as to enable better understanding of the present disclosure from details given in the description below. Additional technical features and advantages forming the subject matter of the claims of present disclosure are provided in the description below. A person skilled in the art of the present disclosure should understand that it would be easy to implement objects same as those of the present disclosure by modifying or designing of other structures or processes on the basis of the concept and specific embodiments disclosed in the description below. Moreover, a person skilled in the art should understand that such equivalent arrangements are to be encompassed within the spirit and scope of the present disclosure as defined by the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1A:
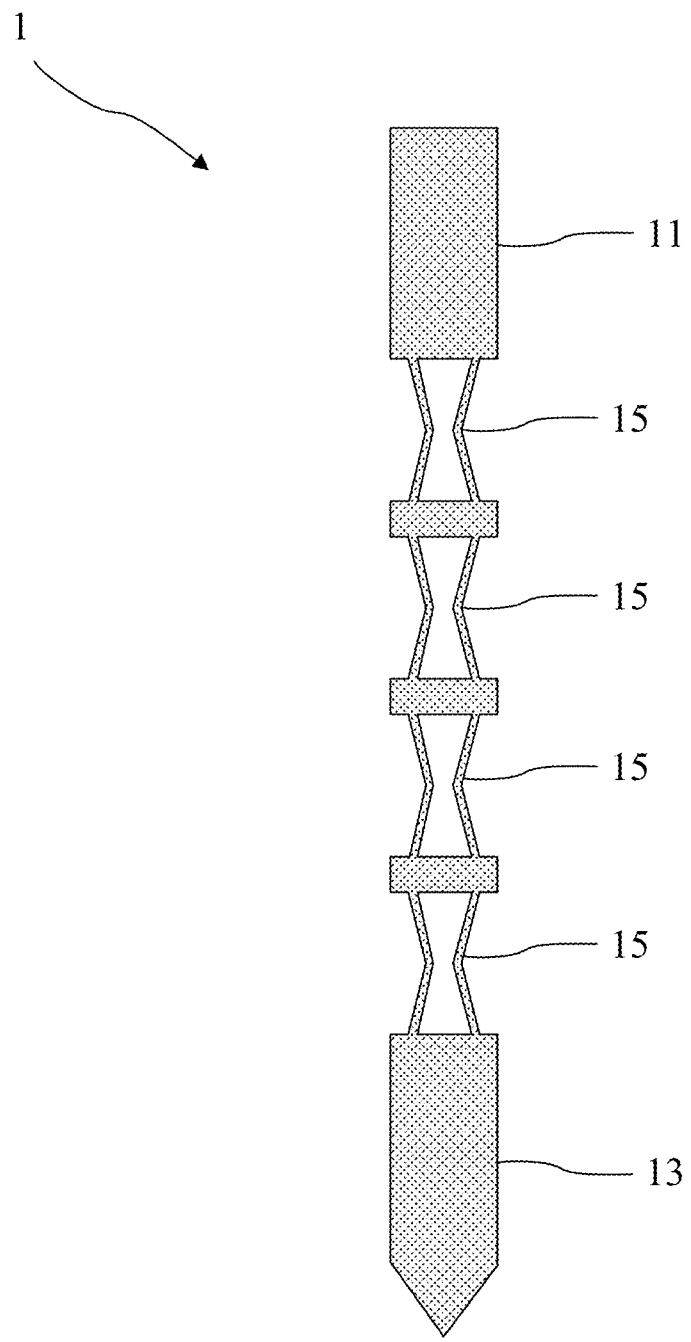
FIG. 1A is an exemplary schematic diagram of a probe according to some embodiments of the present disclosure.

The description of the present disclosure below is accompanied by drawings forming a part of the description to illustrate embodiments of the present disclosure. However, it should be noted that the present disclosure is not limited to these embodiments. Moreover, the embodiments below can be appropriately integrated into another embodiment.

The terms "embodiment," "an embodiment," "exemplary embodiment," "other embodiment" and "another embodiment" mean that the embodiments described in the present disclosure can include specific features, structures or characteristics; however, it should be noted that not every embodiment needs to include such specific features, structures or characteristics. In addition, repeated use of the expression "in the embodiment" or "of the embodiment" does not necessarily refer to the same embodiment, but may refer to the same embodiment.

To fully understand the present disclosure, steps and structures are described in detail below. It should be obvious that implementation of the present disclosure does not limit specific details generally known to persons skilled in the art. Further, generally known structures and steps are not described in detail, so as to prevent unnecessary limitation to the present disclosure. Preferred embodiments of the present disclosure are described in detail below. However, apart from the detailed description, the present disclosure can also be extensively applied in other embodiments. The scope of the present disclosure is not limited to the contents given in the detailed description, but is to be defined in accordance with the appended claims.

It should be understood that the disclosure below provides various different embodiments or implementation examples for implementing different features of the present disclosure. Specific embodiments or implementation examples of components and arrangements are set forth below to simplify the present disclosure. It should be noted that such details are exemplary and are not to be intended to be restrictive. For example, a size of an element is not limited to a disclosed range or value, but can depend on an expected property of a manufacturing condition and/or device. Moreover, in the description below, a first feature described as formed "on" or "above" a second feature may include embodiments in which the first feature and the second feature are formed in a direct contact manner, and may also include embodiments in which an additional feature is formed between the first feature and the second feature in a way that the first feature and the second feature may not be in direct contact. For simplicity and clarity, various features may be depicted according to different scales. In the accompanying drawings, some layers/features are omitted for the sake of simplicity.

Moreover, for better illustration, terms of relative spatial relations such as "beneath," "below," "lower," "above" and "upper" may be used to describe a relation of one element or feature relative to another element or feature. Such terms of relative spatial relations are intended to cover different orientations of the element during use or operation in addition to the orientation depicted in the drawings. An apparatus may be orientated otherwise (rotated 90 degrees or having another orientation) and the descriptive terms of the relative spatial relations used in the literature may also be similarly and correspondingly interpreted.

Please refer to FIG. 1A, which is a schematic diagram of a probe 1 according to some embodiments of the present disclosure. The probe 1 includes a first end portion 11, a second end portion 13 and a plurality of elastic units 15. The first end portion 11 and the second end portion 13 are disposed on two ends of the probe 1. The elastic units 15 are connected to one another, and are connected to the first end portion 11 and the second end portion 13. In some embodiments, the second end portion 13 may include a pointed tip for contacting an integrated circuit chip (not shown) under test.

Figure 1B:
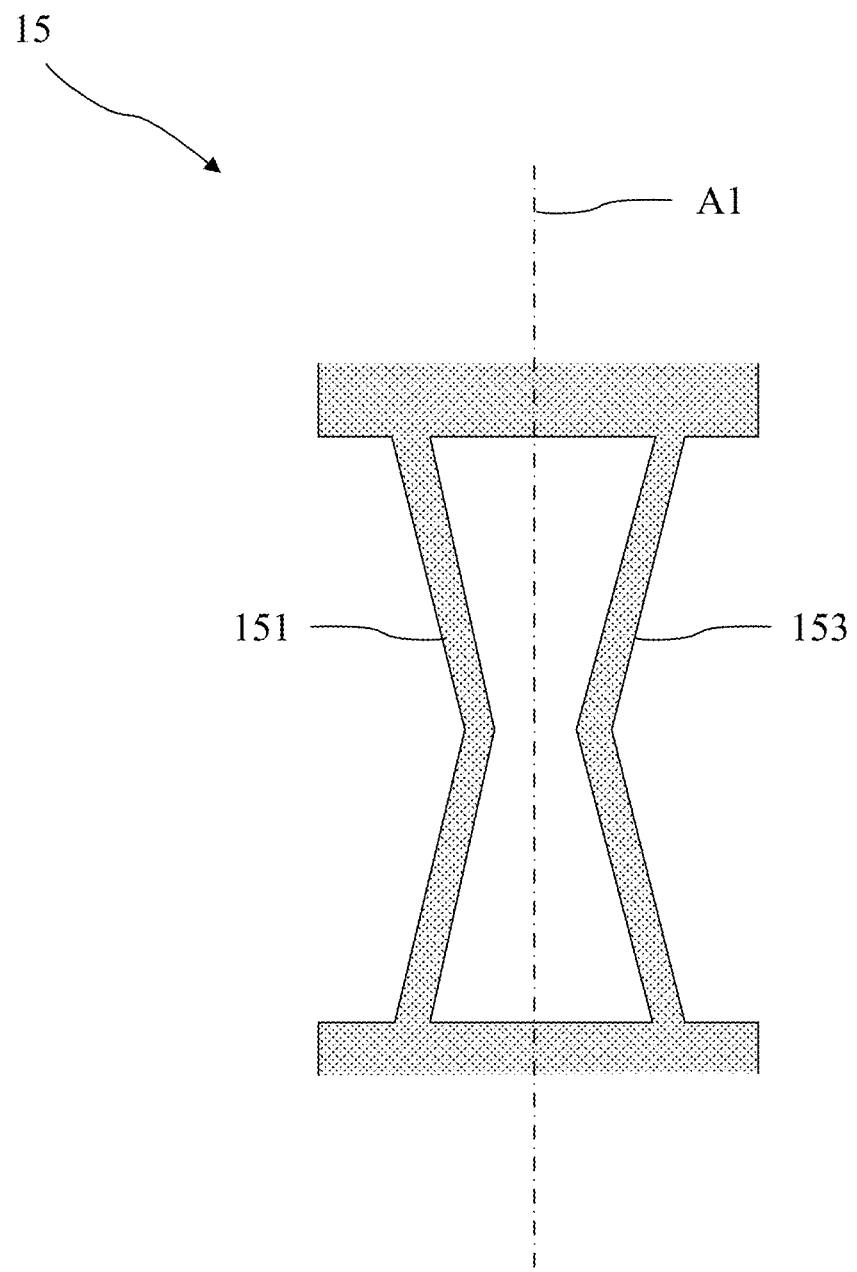
FIG. 1B is an exemplary diagram of an elastic unit according to some embodiments of the present disclosure.

Please refer to FIG. 1B, which is an enlarged diagram of the elastic unit 15 according to some embodiments of the present disclosure. The elastic unit 15 includes a first support element 151 and a second support element 153. The first support element 151 and the second support element 153 are on opposite sides of an axis A1, and the axis A1 extends along a lengthwise direction of the probe 1.

Figure 1C:
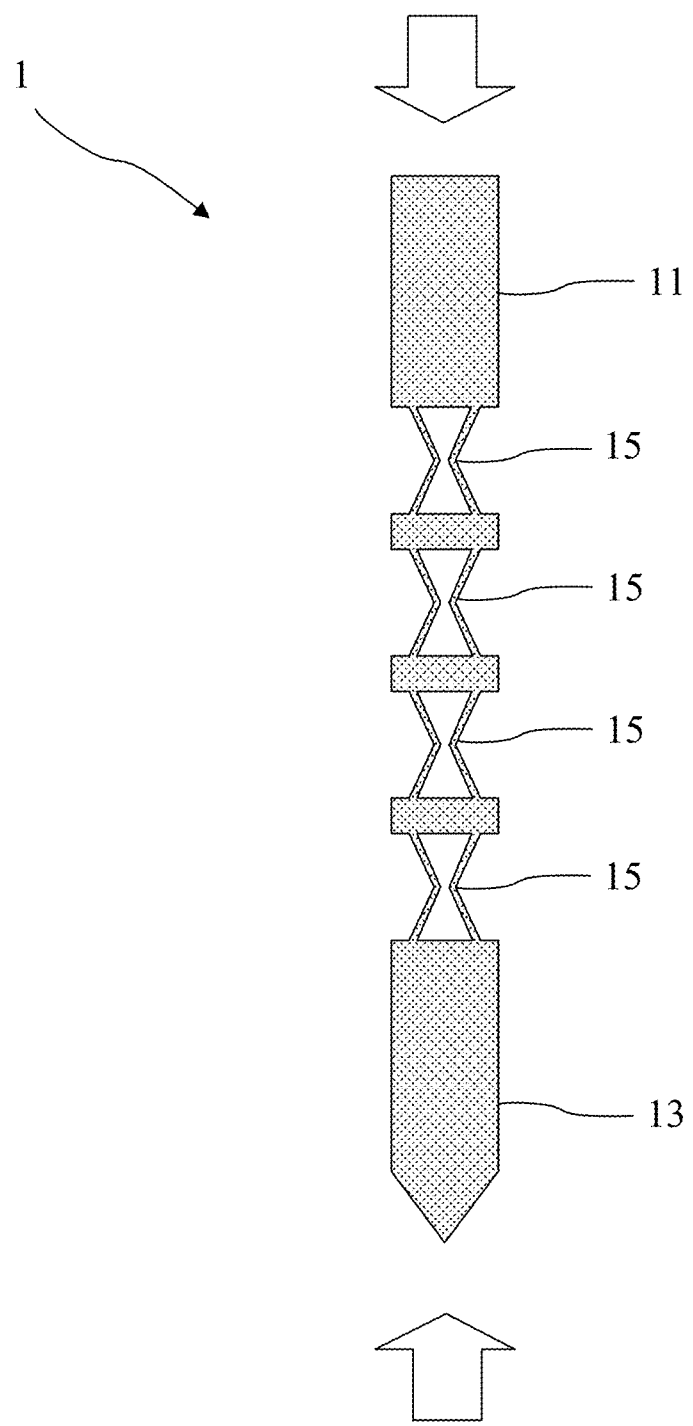
FIG. 1C is an exemplary schematic diagram of a probe receiving a force according to some embodiments of the present disclosure.

Please refer to FIG. 1C, which is a schematic diagram of the probe 1 receiving a force according to some embodiments of the present disclosure. In some embodiments, when the first end portion 11 and the second end portion 13 of the probe 1 are subjected to the force (as shown by large arrows in FIG. 1C), the first support element 151 and the second support element 153 of the elastic unit 15 are compressed and thus become deformed, and are converted from an original state (in which no force is applied, as shown in FIG. 1A) to a compressed state shown in FIG. 1C. At such time, a length of the probe 1 is reduced since the elastic units 15 are compressed.

When the force applied to the first end portion 11 and the second end portion 13 of the probe 1 is removed, the first support element 151 and the second support element 153 of the elastic unit 15 return from the compressed state to the original state (in which no force is applied, as shown in FIG. 1A). At such time, the length of the probe 1 returns to an original length since the elastic units 15 are relieved of the force.

In some embodiments, before the first end portion 11 and the second end portion 13 of the probe 1 are subjected to the force (or after the first end portion 11 and the second end portion 13 are subjected to the force), no point of the first support element 151 or the second support element 153 intersects the axis A1.

In some embodiments, deformation of the first support element 151 and the second support element 153 may be symmetrical to deformation of the axis A1, and the symmetrical deformation of the first and second support elements 151 and 153 limits a compression of the axis A1. The symmetrical deformation that limits the compression can prevent the probe 1 or the elastic unit 15 from rotating or becoming askew due to non-uniform distribution of the force applied, so as to ensure reliability during the compression of the probe 1 and facilitate good electrical transmission.

Figure 2A:
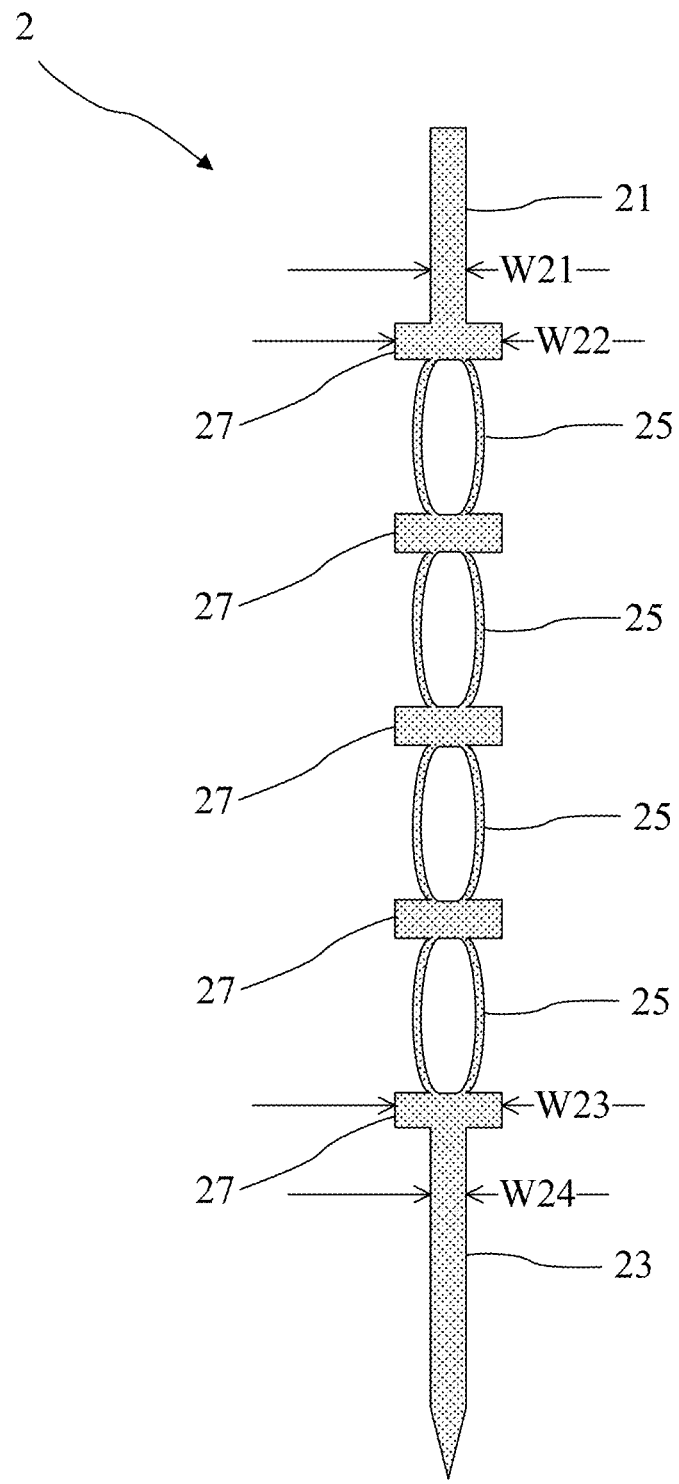
FIG. 2A is an exemplary schematic diagram of a probe according to some embodiments of the present disclosure.

Please refer to FIG. 2A, which is a schematic diagram of a probe 2 according to some embodiments of the present disclosure. The probe 2 includes a first end portion 21, a second end portion 23, a plurality of elastic units 25 and a plurality of connecting units 27. The first end portion 21 and the second end portion 23 are disposed on two ends of the probe 2. The elastic units 25 are connected to one another via the connecting units 27, and are connected to the first end portion 21 and the second end portion 23. The first end portion 21 has different widths W21 and W22, and the second end portion 23 has different widths W23 and W24. The second end portion 23 may include a pointed tip for contacting an integrated circuit chip (not shown) under test.

Figure 2B:
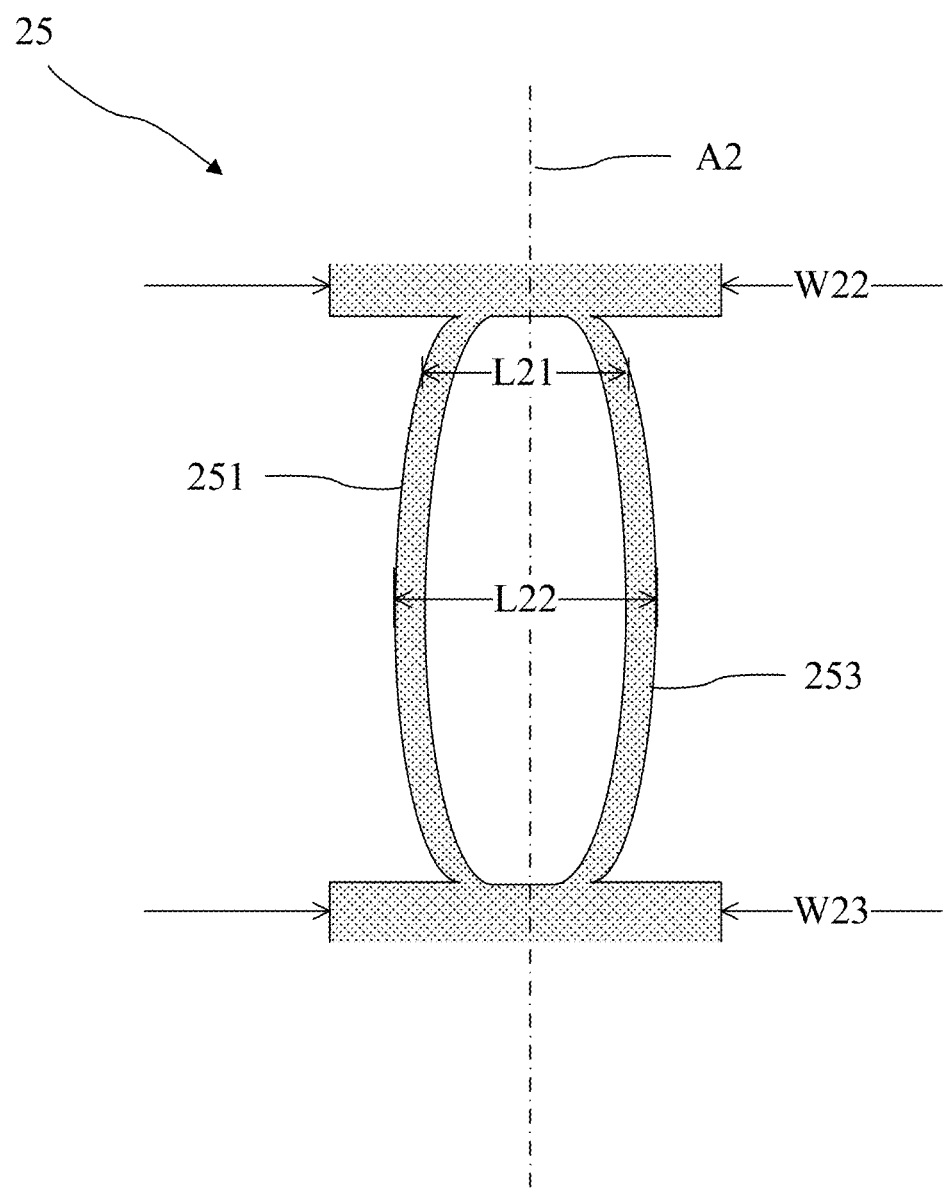
FIG. 2B is an exemplary diagram of an elastic unit according to some embodiments of the present disclosure.

Please refer to FIG. 2B, which is an enlarged diagram of the elastic unit 25 according to some embodiments of the present disclosure. Each elastic unit 25 includes a first support element 251 and a second support element 253. The first support element 251 and the second support element 253 are on opposite sides of an axis A2, and the axis A2 extends along a lengthwise direction of the probe 2. In some embodiments, the axis A2 is a centerline of the probe 2, and the first support element 251 and the second support element 253 have a same non-linear shape and are arranged in a mirrored configuration on opposite sides of the axis A2. As such, when the probe 2 is subjected to a force, the first support element 251 and the second support element 253 of the elastic unit 25 can bear the force in a uniform manner and be deformed.

In some embodiments, the maximum width W22 of the first end portion 21 and the maximum width W23 of the second end portion 23 of the probe 2 are equal, and a length of a line segment between the first support element 251 and the second support element 253 and perpendicular to the axis A2 is less than the maximum width W22/W23. For example, line segments L21 and L22 perpendicular to the axis A2 extend between the first support element 251 and the second support element 253, wherein lengths of both of the line segments L21 and L22 are less than the maximum width W22/W23.

In some embodiments, before the first end portion 21 and the second end portion 23 of the probe 2 are subjected to a force (or after the first end portion 21 and the second end portion 23 are subjected to a force), no point of the first support element 251 or the second support element 253 intersects the axis A2.

Figure 2C:
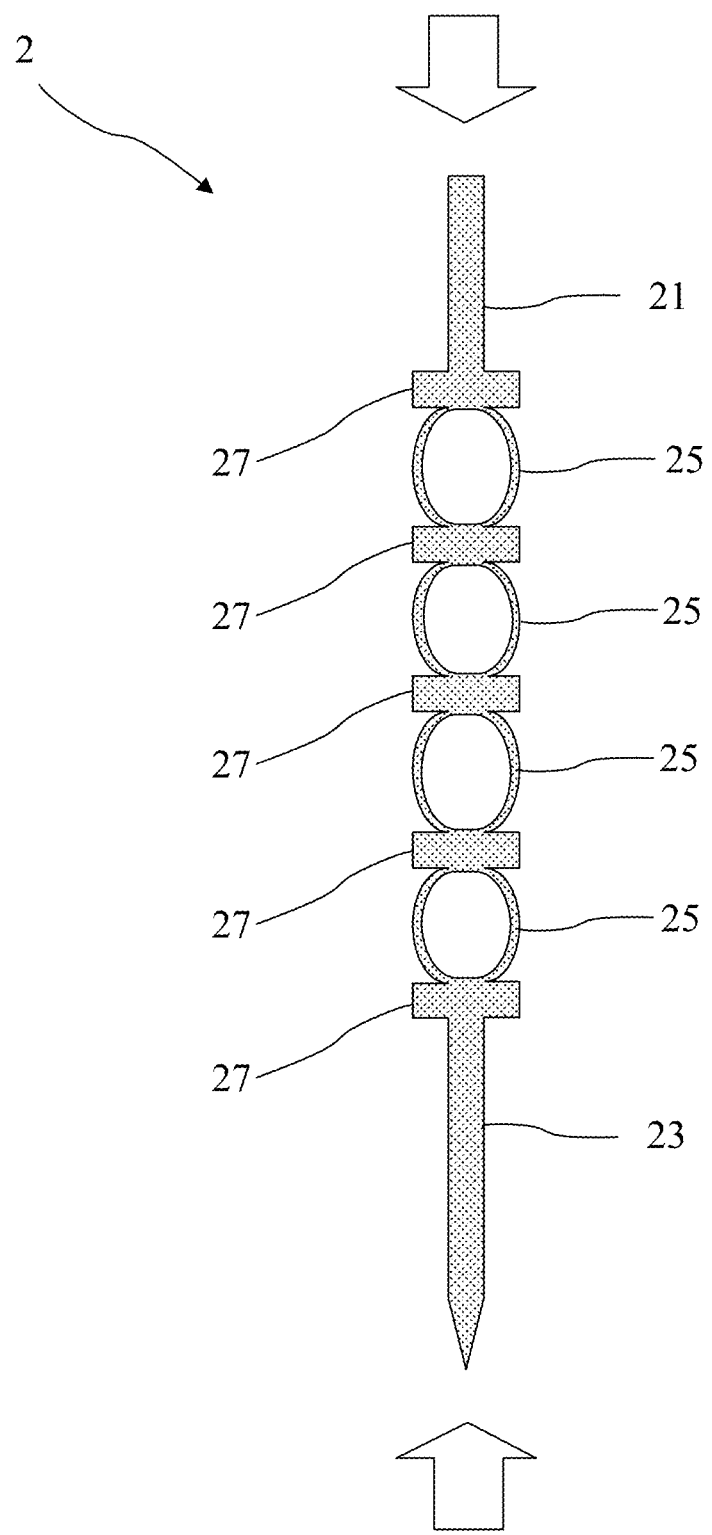
FIG. 2C is an exemplary schematic diagram of a probe receiving a force according to some embodiments of the present disclosure.

Please refer to FIG. 2C, which is a schematic diagram of the probe 2 receiving a force according to some embodiments of the present disclosure. In some embodiments, when the first end portion 21 and the second end portion 23 of the probe 2 are subjected to a force (as shown by large arrows in FIG. 2C), the first support element 251 and the second support element 253 of the elastic unit 25 are compressed and thus become deformed, and are converted from an original state (in which no force is applied, as shown in FIG. 2A) to a compressed state shown in FIG. 2C. At such time, a length of the probe 2 is reduced since the plurality of the elastic units 25 are compressed.

In some embodiments, the deformation of the first support element 251 and the deformation of the second support element 253 may be symmetrical to deformation of the axis A2, and the symmetrical deformation of the first and second support elements 251 and 253 limits a compression of the axis A2. The symmetrical deformation that limits the compression can prevent the probe 2 and the elastic unit 25 from rotating or becoming skewed due to non-uniform distribution of the force applied, so as to ensure reliability during the compression of the probe 2 and facilitate good electrical transmission.

Figure 2D:
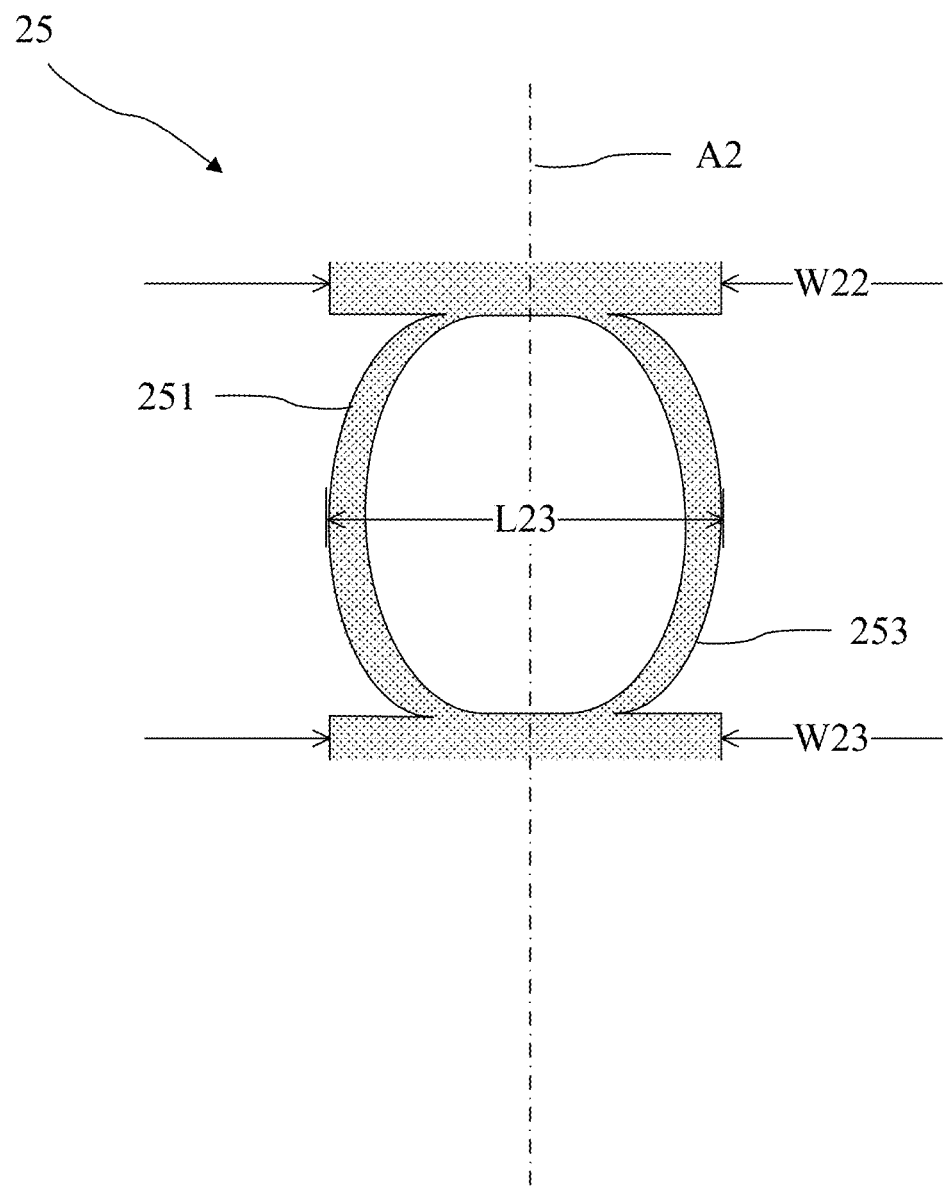
FIG. 2D is an exemplary diagram of an elastic unit being compressed according to some embodiments of the present disclosure.

Please refer to FIG. 2D, which is an enlarged diagram of the elastic unit 25 being compressed according to some embodiments of the present disclosure. In some embodiments, the first support element 251 and the second support element 253 have a shape (for example, an arc protruding in a direction away from the axis A2, as shown in the drawings). When the first end portion 21 and the second end portion 23 of the probe 2 are subjected to a force and the probe 2 is compressed, the first support element 251 and the second support element 253 are deformed in a protruding manner in a direction away from the axis A2, and a length of a longest line segment between the deformed first support element 251 and the deformed second support element 253, perpendicular to the axis A2, is less than or equal to the maximum width W22/W23. For example, a longest line segment L23 perpendicular to the axis A2 extends between the first support element 251 and the second support element 253, wherein a length of the line segment L23 is less than or equal to the maximum width W22/W23.

When the force applied to the first end portion 21 and the second end portion 23 of the probe 2 is removed, the first support element 251 and the second support element 253 of the elastic unit 25 are returned from the compressed state to the original state (in which no force is applied, as shown in FIG. 2A). At such time, the length of the probe 2 is returned to an original length since the plurality of the elastic units 25 are relieved of the force.

In some embodiments, pairs of the elastic units 25 are arranged in a mirrored configuration on two opposite sides of the connecting unit 27 connected to the elastic units 25. With such structure, a force can be uniformly distributed on the entire probe 2 when the probe 2 is subjected to the force, thereby effectively preventing the probe 2 from becoming skewed.

In some embodiments, by adjusting lengths of the support elements 251 and 253 in coordination with changes in a size and a number of the connecting units 27, the compression of the support elements 251 and 253 can be controlled.

In some embodiments, an elasticity of the probe 2 can be appropriately adjusted based on an external force to be applied to the probe 2. The elasticity of the probe 2 can be adjusted by at least (1) adjusting lengths of the support elements 251 and 253, (2) adjusting thicknesses of the support elements 251 and 253, and (3) adjusting a number of the elastic units 25.

In some embodiments, a position of at least one end of the probe 2 is limited, and when at least a part of the probe 2 is subjected to a lateral force of at least one guide plate, the at least a part of the probe 2 is displaced from the axis A2. In some embodiments, the at least a part of the probe 2 includes the first end portion 21, the second end portion 23, at least one elastic unit 25, and at least one connecting unit 27 or a combination of the above. The displacement of the at least a part of the probe 2 from the axis A2 when the probe 2 is subjected to the lateral force is described by way of different embodiments below. However, it should be noted that these embodiments are not to be construed as limitations to the present disclosure, and a person skilled in the art would be able to understand, by referring to the description below, various possible manners in which the at least a part of the probe 2 is displaced from the axis A2 when the probe 2 is subjected to the lateral force.

Figure 2E:
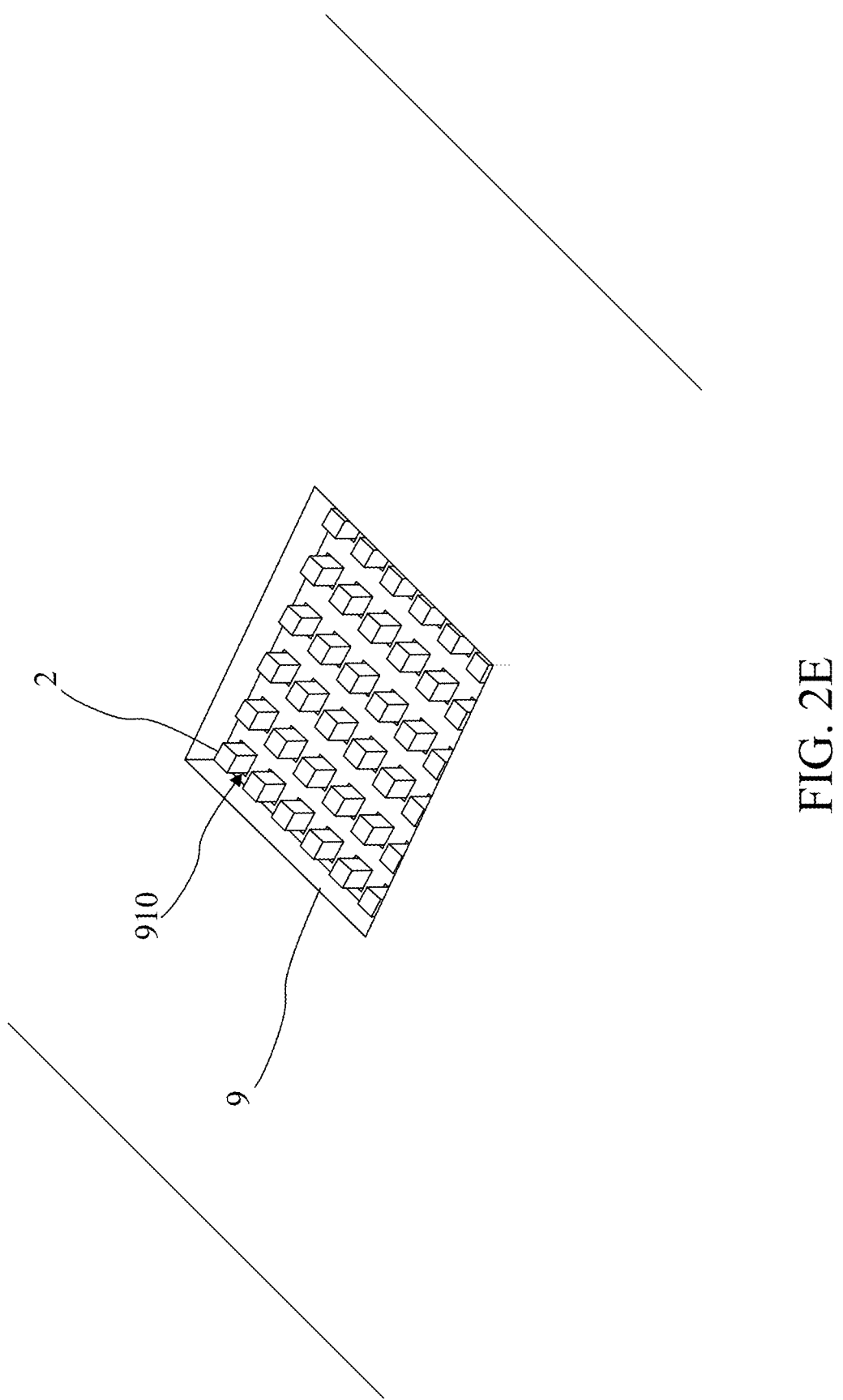
FIG. 2E to FIG. 2G are exemplary schematic diagrams of a probe being curved according to some embodiments of the present disclosure.
Figure 2F:
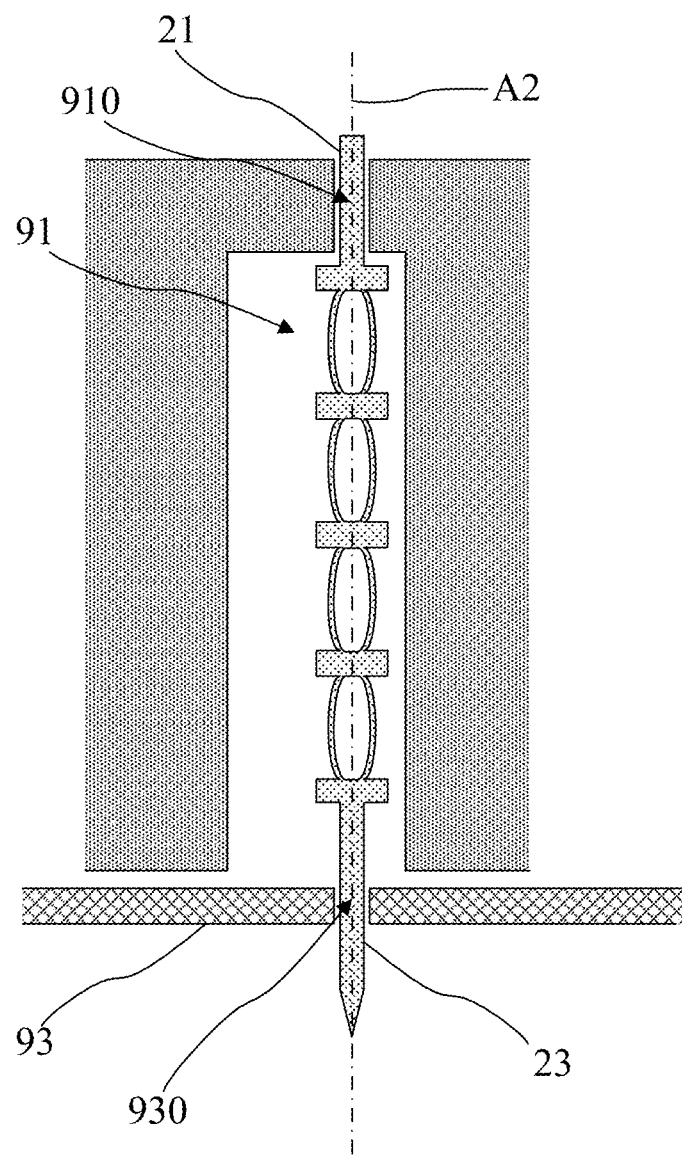
Figure 2G:
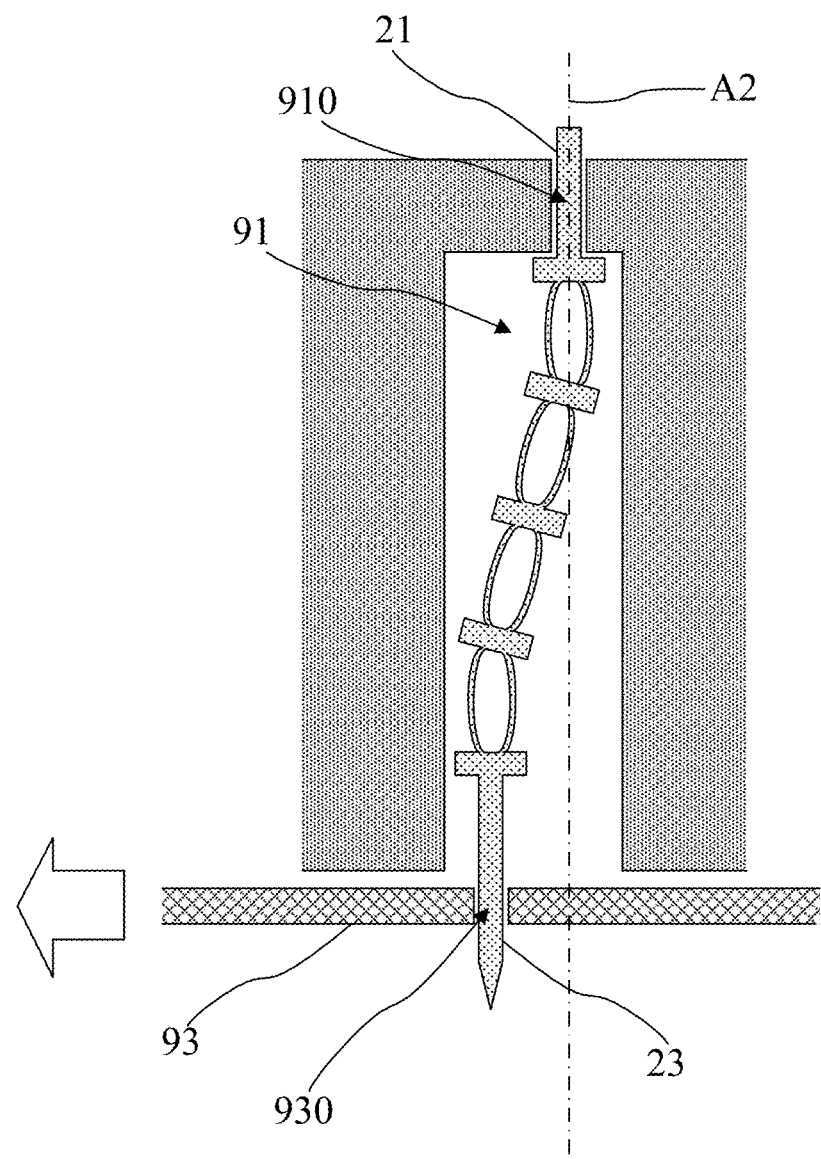

Referring to FIG. 2E to FIG. 2G, in some embodiments, when the probe 2 is used for final testing of a package, as shown in FIG. 2E, a plurality of probes 2 are arranged at a socket 9. As shown in FIG. 2F, the first end portion 21 of the probe 2 is limited at a neck 910 of an accommodating space 91 of the socket 9, and the second end portion 23 of the probe 2 is arranged at an opening 930 of a guide plate 93. When the guide plate 93 is moved as shown in FIG. 2G, the second end portion 23 of the probe 2 is subjected to a lateral force of the guide plate 93 and the second end portion 23 is thus displaced from the axis A2.

Figure 2H:
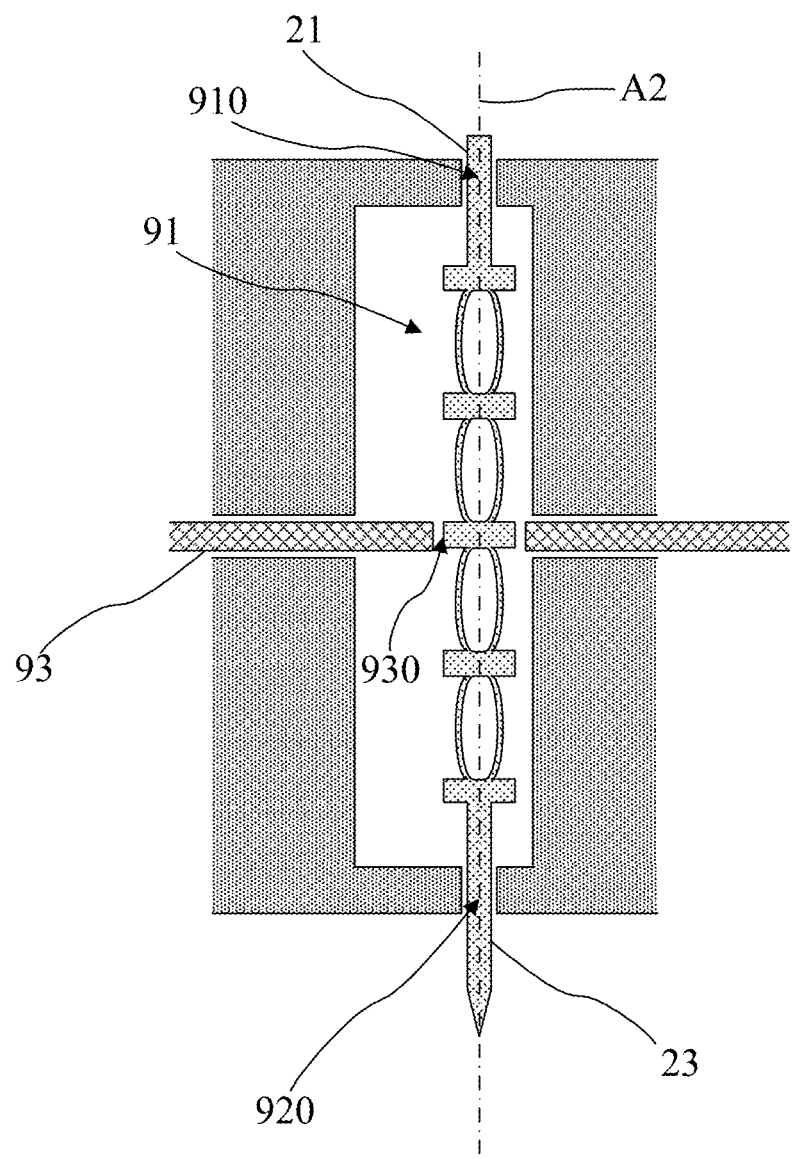
FIG. 2H to FIG. 2I are exemplary schematic diagrams of a probe being curved according to some embodiments of the present disclosure.
Figure 2I:
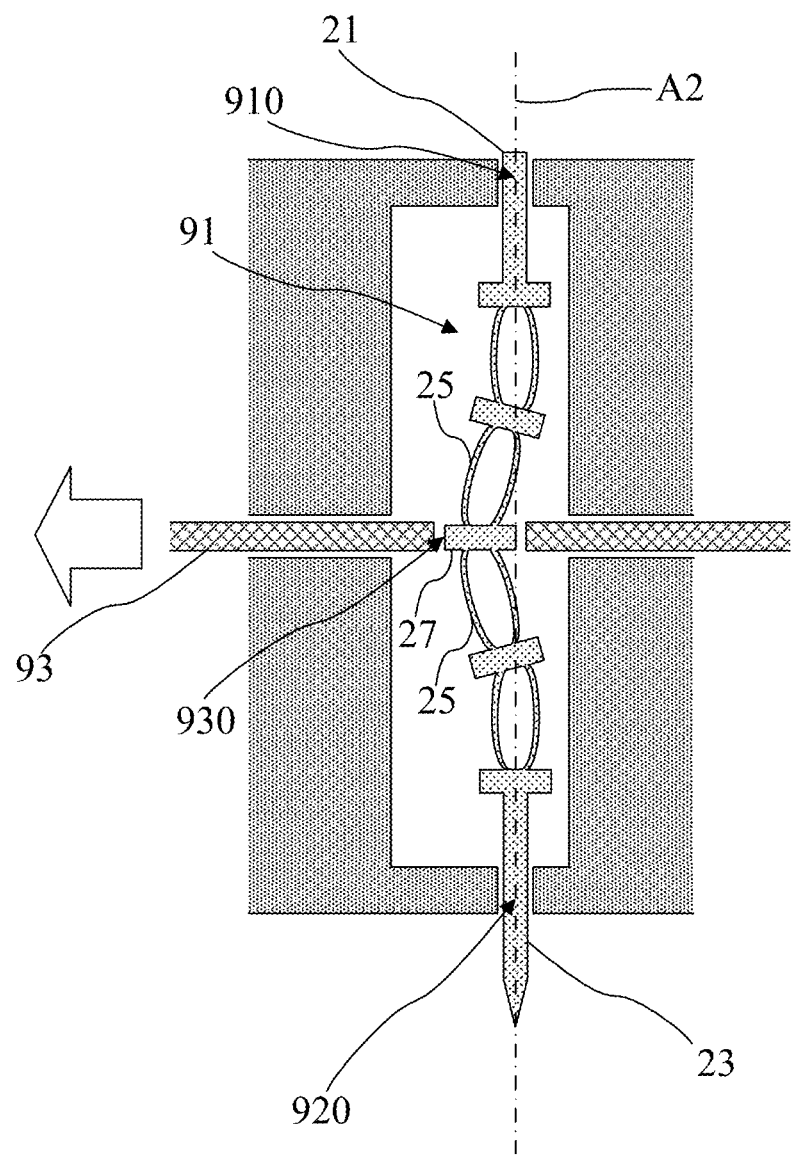

Referring to FIG. 2H and FIG. 2I, in some embodiments, when the probe 2 is used for final testing of a package, as shown in FIG. 2H, the first end portion 21 and the second end portion 23 of the probe 2 are respectively limited at the necks 910 and 920 of the accommodating space 91, and a middle section of the probe 2 is arranged at the opening 930 of the guide plate 93. When the guide plate 93 is moved as shown in FIG. 2I, the middle section of the probe 2 is subjected to a lateral force of the guide plate 93, such that at least one elastic unit 25 or at least one connecting unit 27 at the middle section is displaced from the axis A2.

Figure 2J:
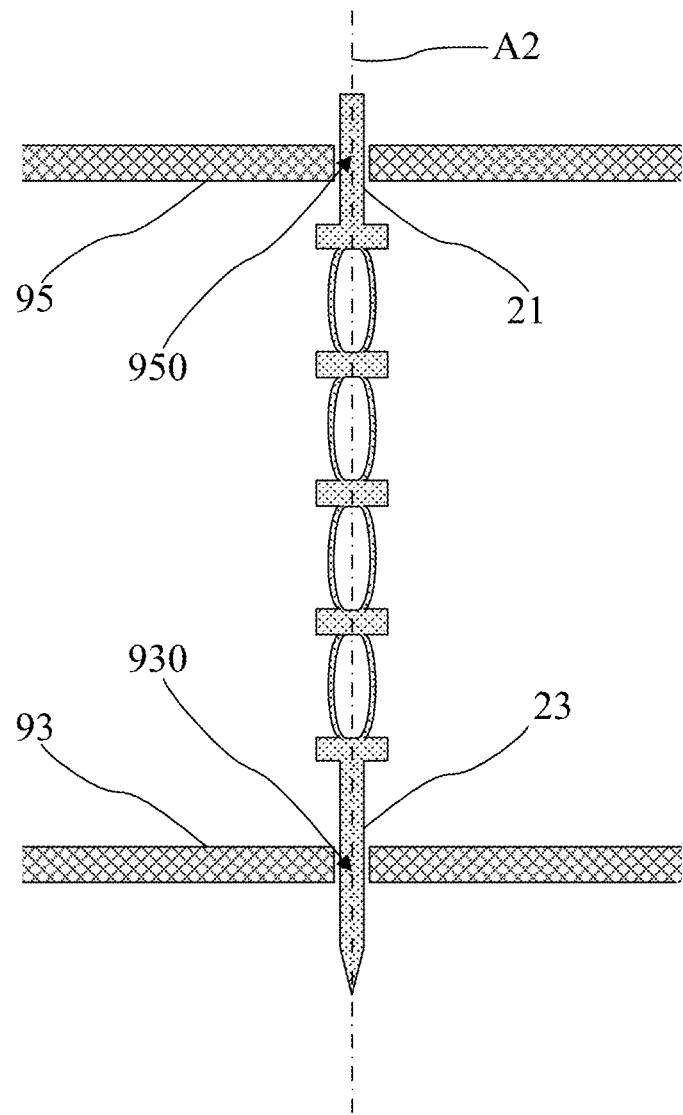
FIG. 2J to FIG. 2L are exemplary schematic diagrams of a probe being curved according to some embodiments of the present disclosure.
Figure 2K:
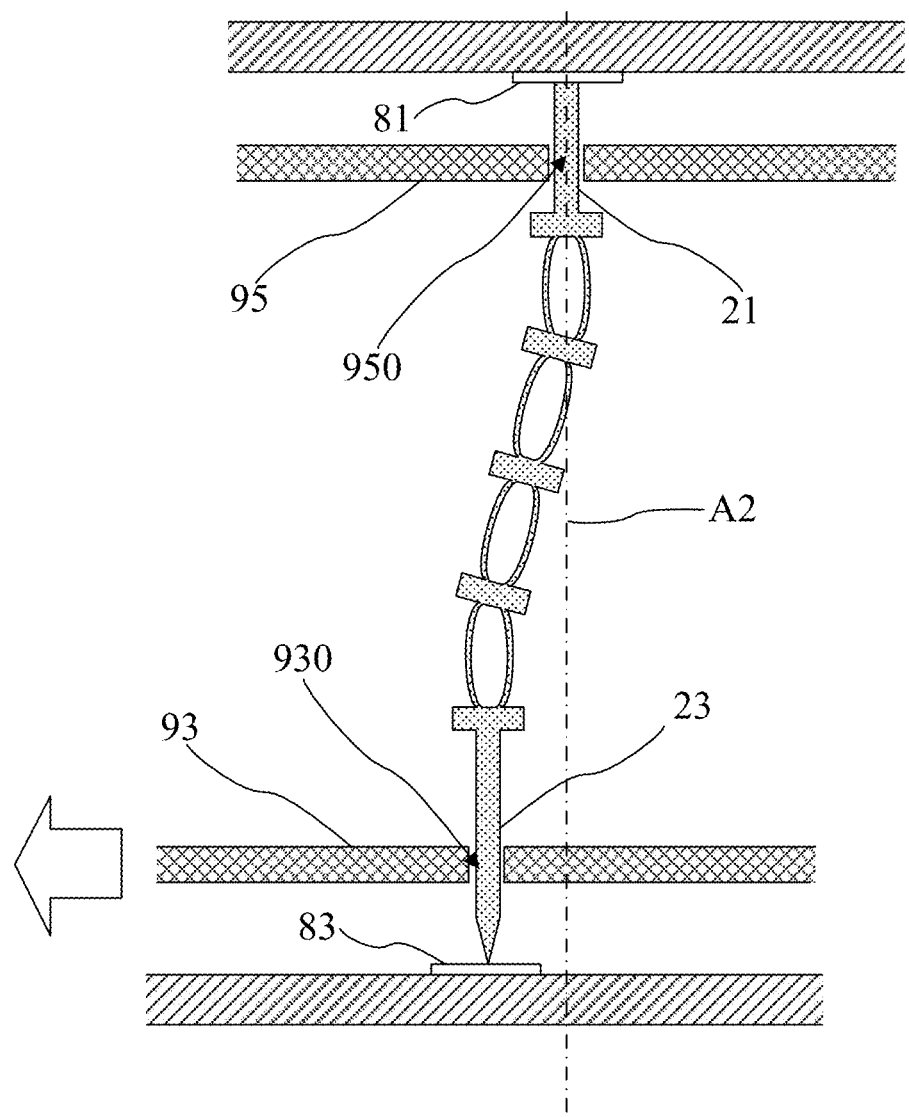
Figure 2L:
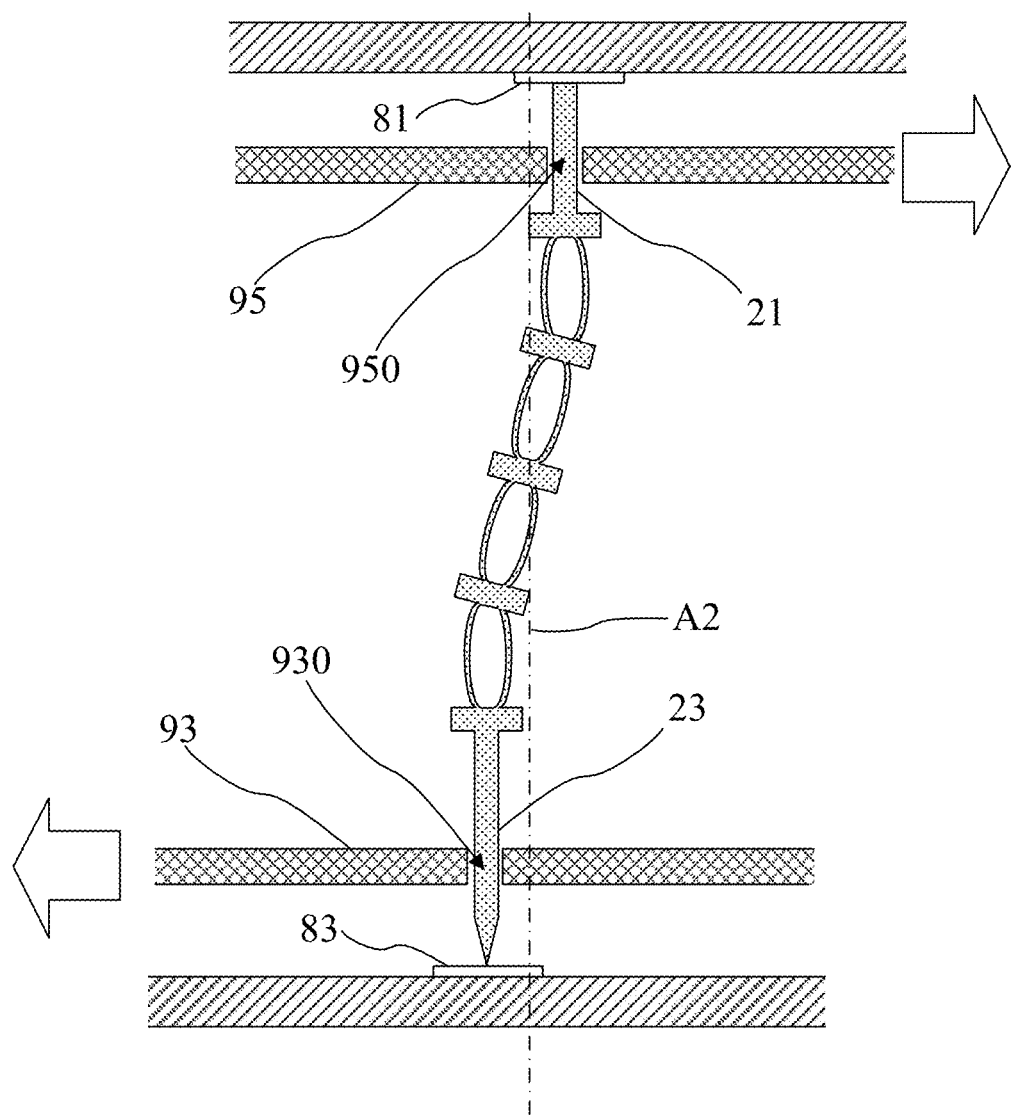

Referring to FIG. 2J to FIG. 2L, in some embodiments, when the probe 2 is used for circuit probing of a wafer, as shown in FIG. 2J, the first end portion 21 of the probe 2 is arranged at an opening 950 of a guide plate 95, and the second end portion 23 of the probe 2 is arranged at the opening 930 of the guide plate 93. When the guide plate 93 is moved as shown in FIG. 2K, the second end portion 23 of the probe 2 is subjected to a lateral force of the guide plate 93 and is thus displaced from the axis A2. When the guide plates 93 and 95 are moved in opposite directions as shown in FIG. 2L, the first end portion 21 and the second end portion 23 of the probe 2 respectively are subjected to lateral forces of the guide plates 95 and 93 and are thus displaced in different directions from the axis A2. Once the probe 2 is curved by the movement of the guide plates 93 and 95, the first end portion 21 comes into contact with an electrode 81 and the second end portion 23 comes into contact with an electrode 83.

Figure 3A:
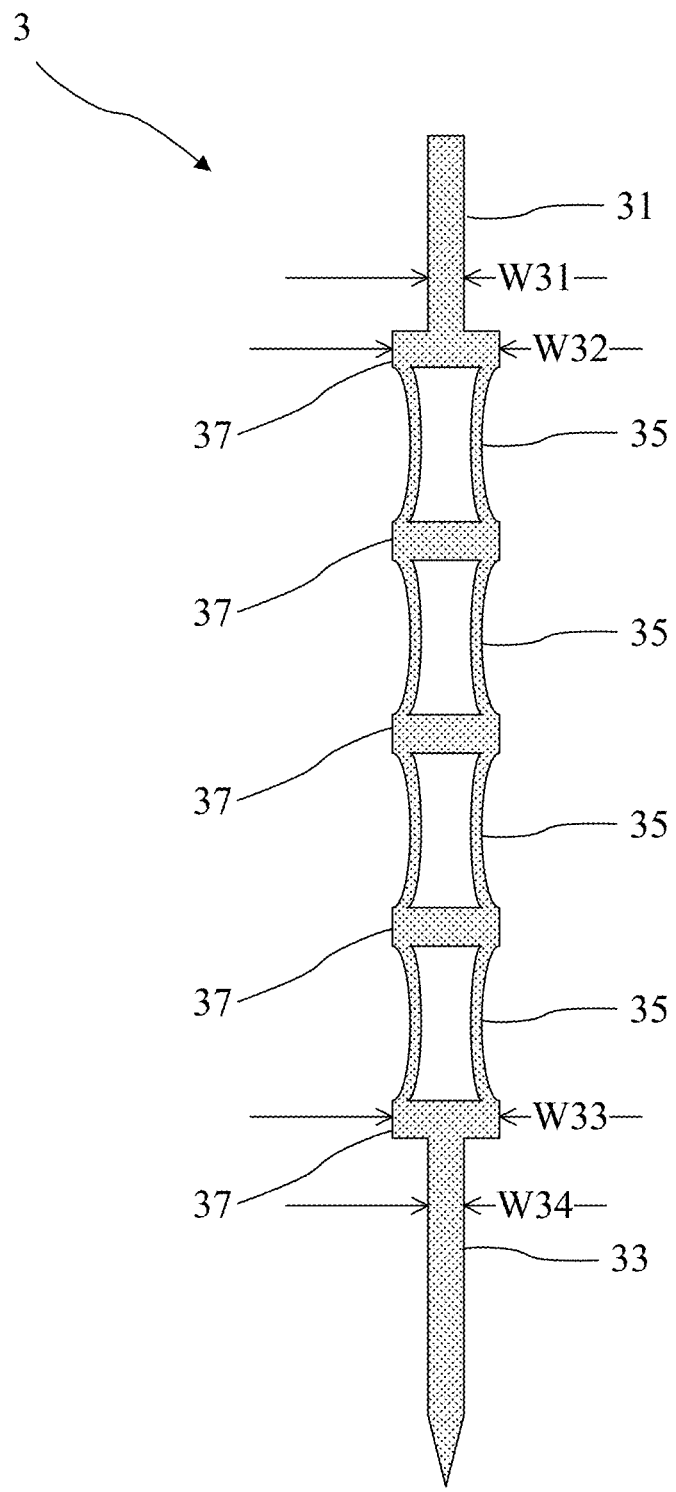
FIG. 3A is an exemplary schematic diagram of a probe according to some embodiments of the present disclosure.

Please refer to FIG. 3A, which is a schematic diagram of a probe 3 according to some embodiments of the present disclosure. The probe 3 includes a first end portion 31, a second end portion 33, a plurality of elastic units 35 and a plurality of connecting units 37. The first end portion 31 and the second end portion 33 are disposed on two ends of the probe 3. The elastic units 35 are connected to one another via the connecting units 37, and are connected to the first end portion 31 and the second end portion 33. The first end portion 31 has different widths W31 and W32, and the second end portion 32 has different widths W33 and W34. The second end portion 33 may include a pointed tip for contacting an integrated circuit chip (not shown) under test.

Figure 3B:
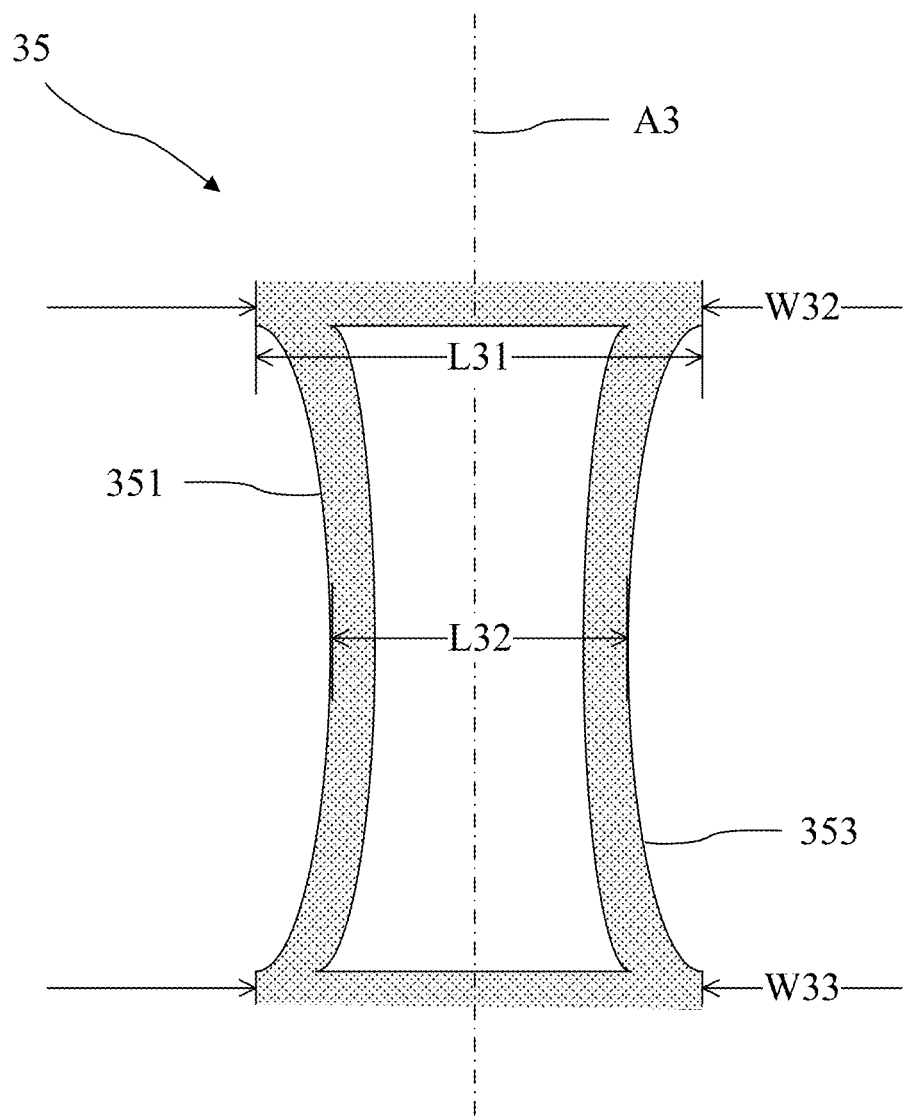
FIG. 3B is an exemplary diagram of an elastic unit according to some embodiments of the present disclosure.

Please refer to FIG. 3B, which is an enlarged diagram of the elastic unit 35 according to some embodiments of the present disclosure. The elastic unit 35 includes a first support element 351 and a second support element 353. The first support element 351 and the second support element 353 are on opposite sides of an axis A3, and the axis A3 extends along a lengthwise direction of the probe 3. In some embodiments, the axis A3 is a centerline of the probe 3, and the first support element 351 and the second support element 353 have a same non-linear shape and are arranged in a mirrored configuration on opposite sides of the axis A3. As such, when the probe 3 is subjected to a force, the first support element 351 and the second support element 353 of the elastic unit 35 can bear the force in a uniform manner and can be deformed.

In some embodiments, the maximum width W32 of the first end portion 31 and the maximum width W33 of the second end portion 33 of the probe 3 are equal, and a length of a line segment between the first support element 351 and the second support element 353 and perpendicular to the axis A3 is less than or equal to the maximum width W32/W33. For example, line segments L31 and L32 perpendicular to the axis A3 extend between the first support element 351 and the second support element 353, wherein a length of the line segment L31 is equal to the maximum width W32/W33, and a length of the line segment L32 is less than the maximum width W32/W33.

In some embodiments, before the first end portion 31 and the second end portion 33 of the probe 3 are subjected to a force (or after the first end portion 31 and the second end portion 33 are subjected to a force), no point of the first support element 351 or the second support element 353 intersects the axis A3.

Figure 3C:
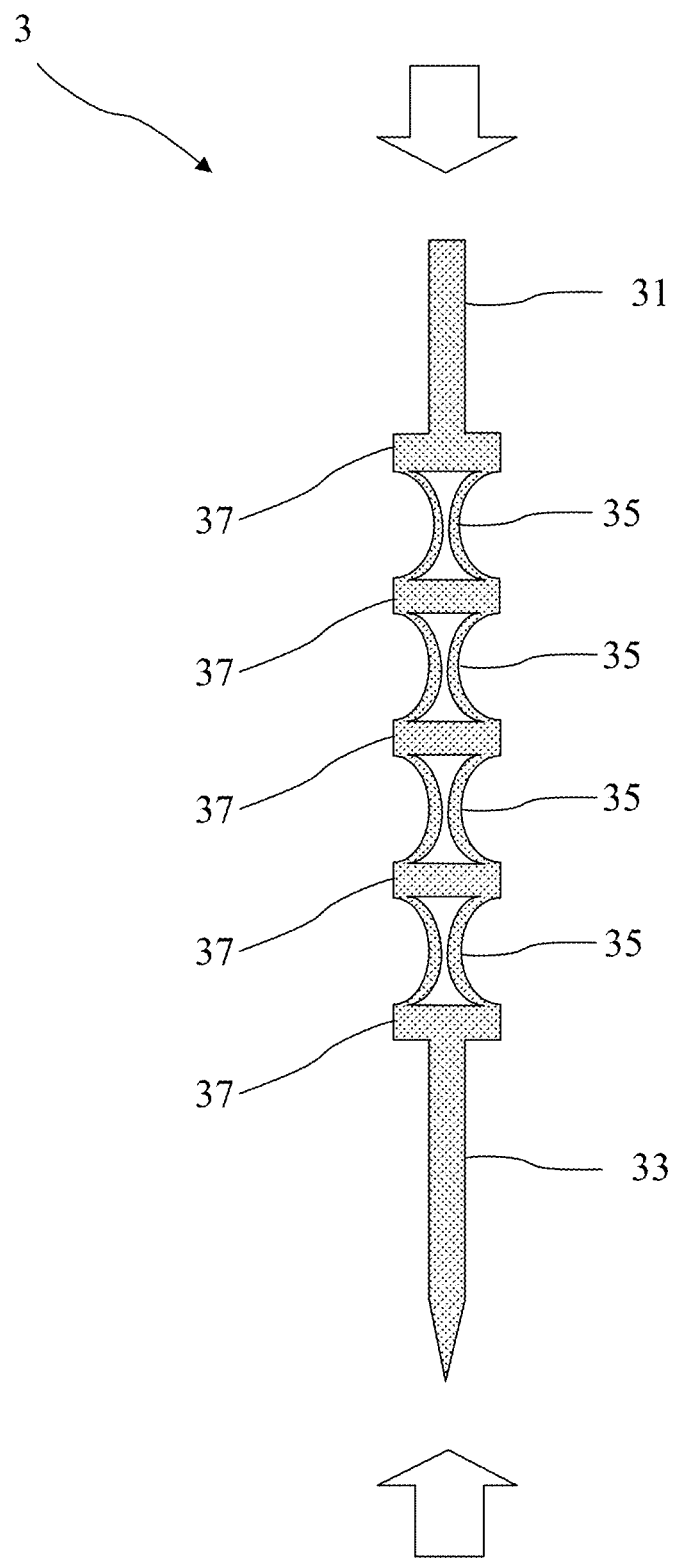
FIG. 3C is an exemplary schematic diagram of a probe receiving a force according to some embodiments of the present disclosure.

Please refer to FIG. 3C, which is a schematic diagram of the probe 3 receiving a force according to some embodiments of the present disclosure. In some embodiments, when the first end portion 31 and the second end portion 33 of the probe 3 are subjected to a force (as shown by large arrows in FIG. 3C), the first support element 351 and the second support element 353 of the elastic unit 35 are compressed and thus become deformed, and are converted from an original state (in which no force is applied, as shown in FIG. 3A) to a compressed state shown in FIG. 3C. At such time, a length of the probe 3 is reduced since the elastic units 35 are compressed.

In some embodiments, the first support element 351 and the second support element 353 have a shape (for example, an arc recessed in a direction toward the axis A3). When the first end portion 31 and the second end portion 33 of the probe 3 are subjected to a force and the probe is compressed, the first support element 351 and the second support element 353 are deformed in a direction toward the axis A3.

In some embodiments, the deformation of the first support element 351 and the deformation of the second support element 353 may be symmetrical to a deformation of the axis A3, and such symmetrical deformation prevents the probe 3 or the elastic unit 35 from rotating, so as to ensure reliability during the compression of the probe 3. In some embodiments, the first support element 351 and the second support element 353 do not come into contact with each other.

When the force applied to the first end portion 31 and the second end portion 33 of the probe 3 is removed, the first support element 351 and the second support element 353 of the elastic unit 35 are returned from the compressed state to the original state (in which no force is applied, as shown in FIG. 3A). At such time, the length of the probe 3 is returned to an original length since the elastic units 35 are relieved of the force.

In some embodiments, pairs of the elastic units 35 are arranged in a mirrored configuration on two opposite sides of the connecting unit 37 connected to the elastic units 35. With such structure, a force can be uniformly distributed on the entire probe 3 when the probe 3 is subjected to the force, thereby effectively preventing the probe 3 from becoming skewed.

Figure 4A:
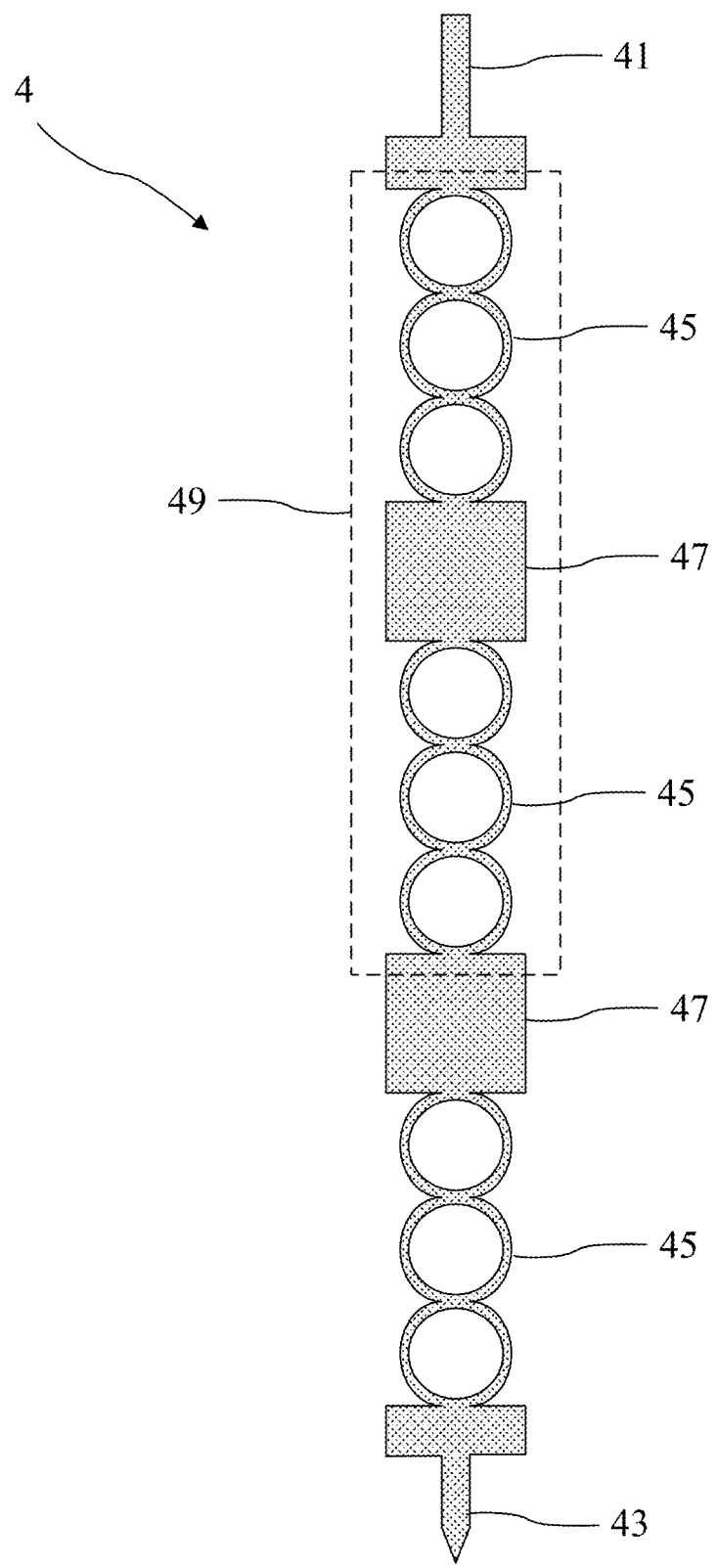
FIG. 4A is an exemplary schematic diagram of a probe according to some embodiments of the present disclosure.

Please refer to FIG. 4A, which is a schematic diagram of a probe 4 according to some embodiments of the present disclosure. The probe 4 includes a first end portion 41, a second end portion 43, a plurality of elastic units 45 and a plurality of connecting units 47. The first end portion 41 and the second end portion 43 are disposed on two ends of the probe 4. The elastic units 45 are connected to one another via the connecting units 47, and are connected to the first end portion 41 and the second end portion 43. Each elastic unit 45 includes two support portions on opposite sides. The second end portion 43 may include a pointed tip for contacting an integrated circuit chip (not shown) under test.

Figure 4B:
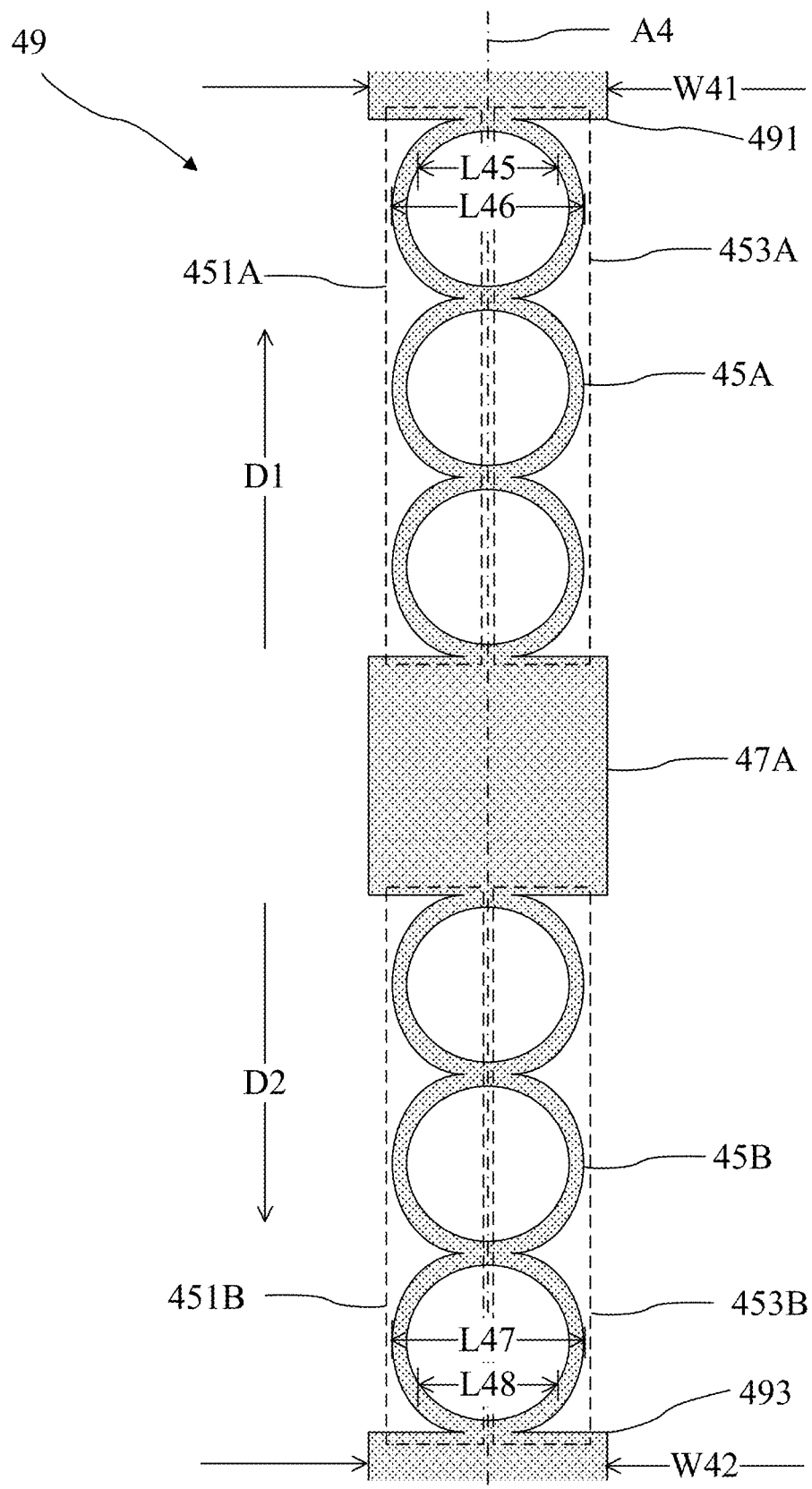
FIG. 4B is an exemplary diagram of an elastic structure according to some embodiments of the present disclosure.

Please refer to FIG. 4B, which is an enlarged diagram of an elastic structure 49 according to some embodiments of the present disclosure. The elastic structure 49 includes a first section 491, a second section 493, a connecting unit 47A, an elastic unit 45A and an elastic unit 45B. The first section 491 can be connected to another elastic structure or the first end portion 41, and the second section 493 can be connected to another elastic structure or the second end portion 43. The elastic unit 45A is connected to the connecting unit 47A, and extends in a first direction D1 (that is, a direction toward the first section 491) from the connecting unit 47A. The elastic unit 45B is connected to the connecting unit 47A, and extends in a second direction D2 (that is, a direction toward the second section 493) from the connecting unit 47A.

In some embodiments, the probe 4 has an axis A4 extending in a lengthwise direction of the probe 4, and the axis A4 is a centerline of the probe 4. The elastic unit 45A includes, on opposite sides of the axis A4, support portions 451A and 453A for connecting the connecting unit 47A to the first section 491. The elastic unit 45B includes, on opposite sides of the axis A4, support portions 451B and 453B for connecting the connecting unit 47A to the second section 493.

In the structure of the elastic unit 45A, the support portion 451A and the support portion 453A are arranged in a mirrored configuration on opposite sides of the axis A4, and a length of a line segment formed between any point of the support portion 451A and any point of the support portion 453A and perpendicular to the first direction D1 is less than a maximum width W41 of the first section 491. In the structure of the elastic unit 45B, the support portion 451B and the support portion 453B are arranged in a mirrored configuration on opposite sides of the axis A4, and a length of a line segment formed between any point of the support portion 451B and any point of the support portion 453B and perpendicular to the second direction D2 is less than a maximum width W42 of the second section 493.

For example, line segments L45 and L46 perpendicular to the first direction D1 extend between the support portions 451A and 453A, wherein lengths of both of the line segments L45 and L46 are less than the maximum width W41. Line segments L47 and L48 perpendicular to the second direction D2 extend between the support portions 451B and 453B, wherein lengths of both of the line segments L47 and L48 are less than the maximum width W42.

Figure 4C:
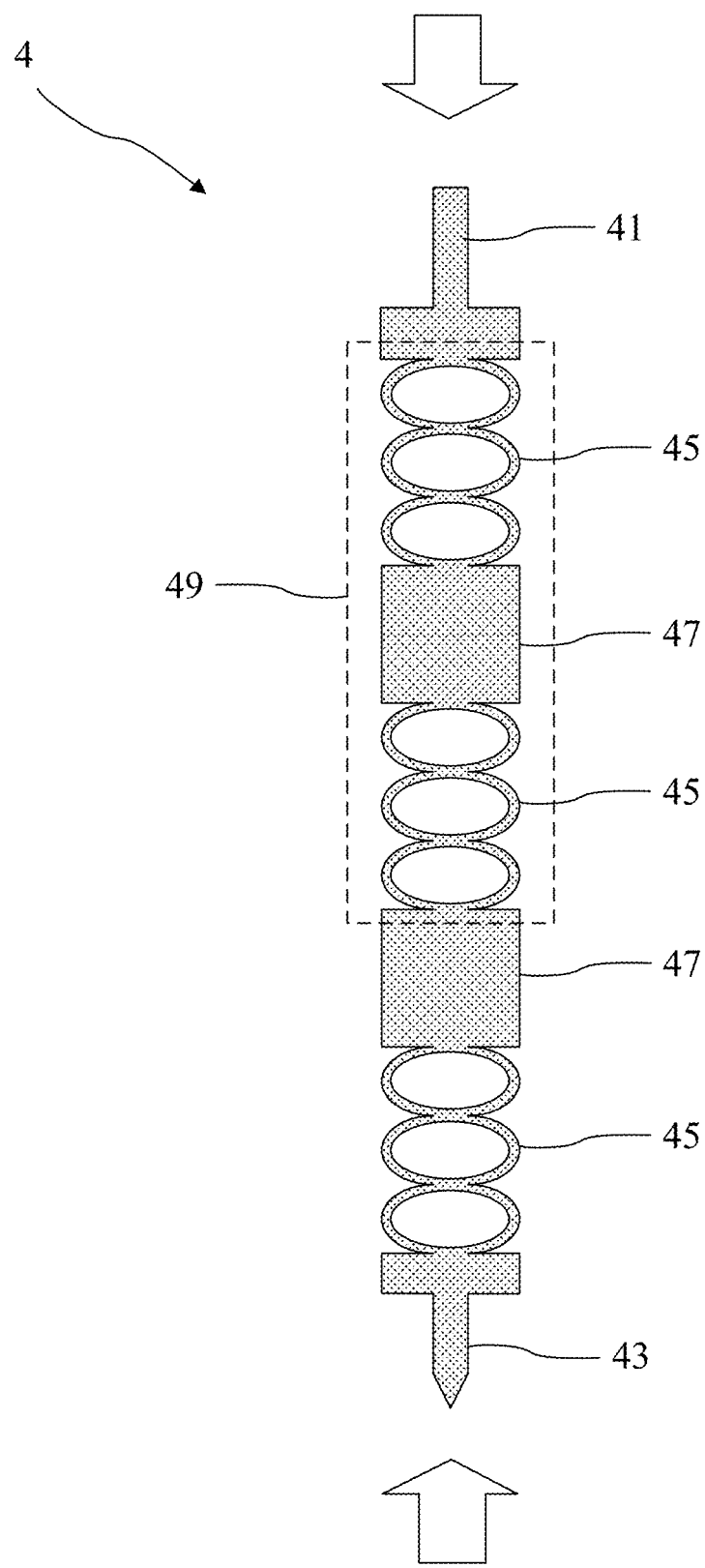
FIG. 4C is an exemplary schematic diagram of a probe receiving a force according to some embodiments of the present disclosure.

Please refer to FIG. 4C, which is a schematic diagram of the probe 4 receiving a force according to some embodiments of the present disclosure. In some embodiments, when the first end portion 41 and the second end portion 43 of the probe 4 are subjected to a force (as shown by large arrows in FIG. 4C), the two support portions of the elastic unit 45 are compressed and thus become deformed, and are converted from an original state (in which no force is applied, as shown in FIG. 4A) to a compressed state shown in FIG. 4C. At such time, a length of the probe 4 is reduced since the elastic units 45 are compressed.

Figure 4D:
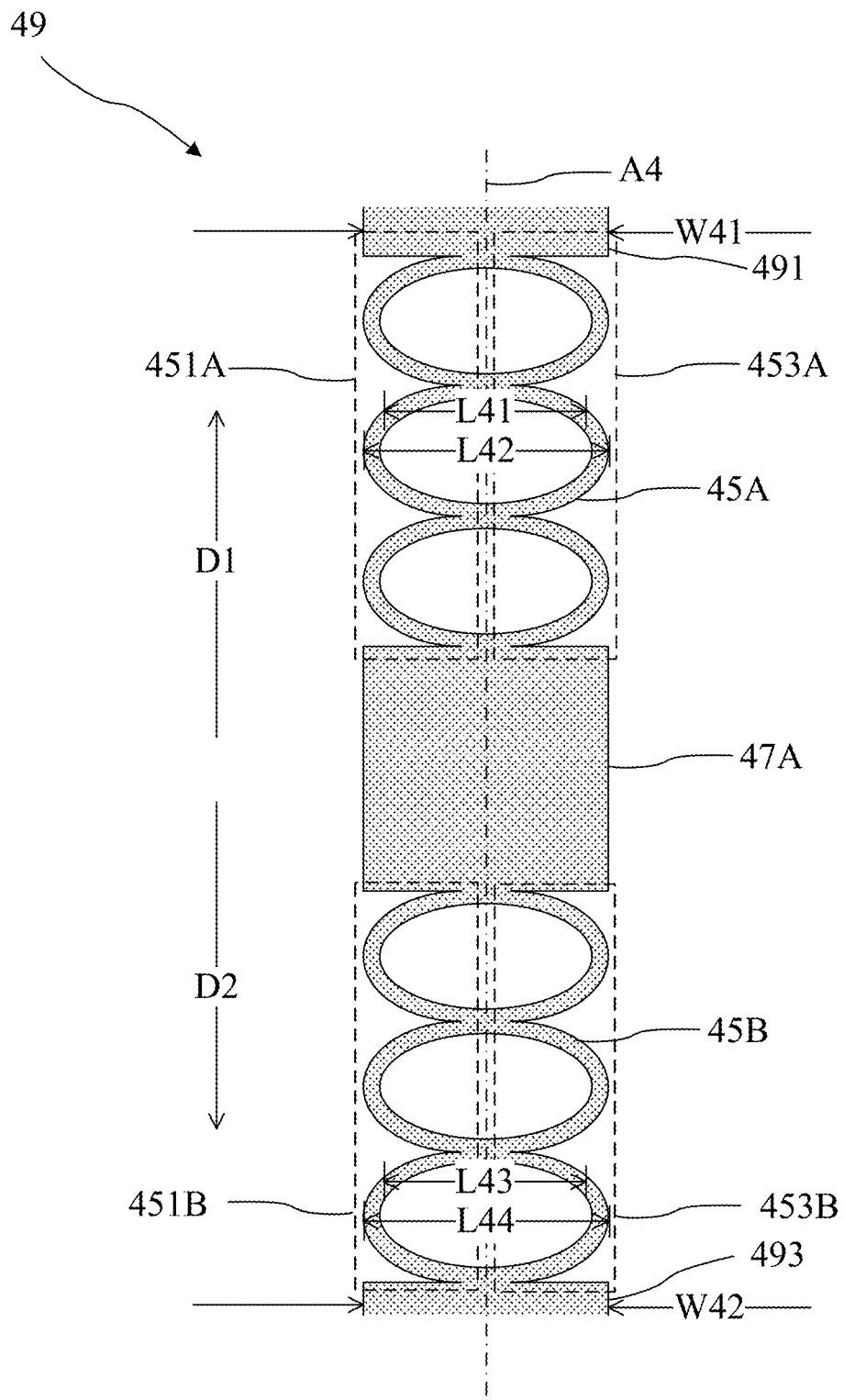
FIG. 4D is an exemplary diagram of an elastic structure being compressed according to some embodiments of the present disclosure.

Please refer to FIG. 4D, which is an enlarged diagram of the elastic structure 49 being compressed according to some embodiments of the present disclosure. In some embodiments, the support portions 451A and 451B have a shape (for example, a plurality of semicircular shapes, each of which protrudes in a direction away from the axis A4, as shown in the drawings). When the first end portion 41 and the second end portion 43 of the probe 4 are subjected to a force and the probe 4 is compressed, the support portions 451A and 453A are deformed in a protruding manner away from the axis A4, and a length of a line segment between the deformed support portions 451A and 453A and perpendicular to the first direction D1 is less than or equal to the maximum width W41 of the first section 491. For example, line segments L41 and L42 perpendicular to the first direction D1 extend between the deformed support portions 451A and 453A, wherein a length of the line segment L41 is less than the maximum width W41, and a length of the line segment L42 is equal to the maximum width W41.

Similarly, in some embodiments, the support portions 451B and 453B have a shape (for example, a plurality of semicircular shapes, each of which protrudes in a direction away from the axis A4, as shown in the drawings). When the first end portion 41 and the second end portion 43 of the probe 4 are subjected to a force and the probe 4 is compressed, the support portions 451B and 453B are deformed in a protruding manner away from the axis A4, and between the deformed support portions 451B and 453B, a length of a line segment perpendicular to the second direction D2 is less than or equal to the maximum width W42 of the second section 493. For example, line segments L43 and L44 perpendicular to the second direction D2 extend between the deformed support portions 451B and 453B, wherein a length of the line segment L43 is less than the maximum width W42 and a length of the line segment L44 is equal to the maximum width W42.

In some embodiments, deformation of the support portion 451A and deformation of the support portion 453A may be symmetrical to a deformation of the axis A4, and deformation of the support portion 451B and deformation of the support portion 453B may be symmetrical to the deformation of the axis A4. Such symmetrical deformation prevents the probe 4 and the elastic unit 45 from rotating, so as to ensure reliability during the compression of the probe 4.

When the force applied to the first end portion 41 and the second end portion 43 of the probe 4 is removed, the support portions of the elastic unit 45 are returned from the compressed state to the original state (in which no force is applied, as shown in FIG. 4A). At such time, the length of the probe 4 is returned to an original length since the elastic units 45 are relieved of the force.

In some embodiments, pairs of the elastic units 45 are arranged in a mirrored configuration on opposite sides of the connecting unit 47 connected to the elastic units 45, and the support portions of a pair of the elastic units 45 are arranged in a mirrored configuration on opposite sides of the connecting unit 47 connected to the elastic units 45. For example, the support portion 451A of the elastic unit 45A and the support portion 451B of the elastic unit 45B are arranged in a mirrored configuration on opposite sides of the connecting unit 47A connected to the elastic units 45A and 45B, and the support portion 453A of the elastic unit 45A and the support portion 453B of the elastic unit 45B are arranged in a mirrored configuration on opposite sides of the connecting unit 47A connected to the elastic units 45A and 45B. With such structure, a force can be uniformly distributed on the entire probe 4 when the probe 4 is subjected to the force, thereby effectively preventing the probe 4 from becoming skewed.

It should be noted that, some or all components of the probe of the foregoing embodiments can be formed as an integral unit (i.e., formed as one-piece). For example, the elastic unit (including the support elements) of the probe, the connecting unit, the two end portions of the probe, or any combination thereof can be formed as an integral unit, so as to reinforce the structural strength of the probe and enhance an operation reliability of the probe.

The present disclosure and the advantages thereof are described in detail as above. However, it should be understood that various modifications, replacements and substitutions can be made without departing from the spirit and scope of the present disclosure as defined by the appended claims. For example, various processes above may be implemented by different approaches, and other processes or a combination thereof may be used in substitution for the various processes above.

Moreover, the scope of the present application is not limited to specific embodiments of the processes, machines, manufacture, substance composition, means, methods or steps given in the detailed description. A person skilled in the art could understand from disclosure of the present application that existing or future developed processes, machines, manufacture, substance compositions, means, methods or steps that achieve the same functions or achieve substantially the same results corresponding to those of the embodiments described in the disclosure can be utilized. Accordingly, such processes, machines, manufacture, substance compositions, means, methods and steps are to be encompassed within the scope of the appended claims.

What is claimed is:

1. A probe, comprising:
a first end portion;
a second end portion;
a plurality of elastic units, disposed between the first end portion and the second end portion, each of the elastic units comprising:
a first support element and a second support element, wherein the first support element and the second support element are arranged in a mirrored configuration on opposite sides of an axis, and the axis is a centerline of the probe and extends along a length of the probe;
a plurality of connecting units, wherein the plurality of connecting units are connected to the elastic units, the first end portion and the second end portion;
wherein a length of a line segment between the first support element and the second support element and perpendicular to the axis is less than a width of each connecting unit;
wherein the width of each connecting unit is greater than a width of the first end portion and greater than a width of the second end portion;
wherein when the first end portion and the second end portion of the probe are subjected to a force and the probe is compressed, the first support element and the second support element are deformed in a direction away from the axis, and a length of a longest line segment between the deformed first support element and the deformed second support element and perpendicular to the axis is less than or equal to a maximum width of the first end portion or the second end portion.

2. The probe of claim 1, wherein neither of the first support element and the second support element intersects the axis.

3. The probe of claim 1, wherein the length of the line segment between the first support element and the second support element and perpendicular to the axis is less than or equal to the maximum width of the first end portion or the second end portion.

4. The probe of claim 1, wherein when the first end portion and the second end portion of the probe are subjected to a force and the probe is compressed, each of the first support element and the second support element is deformed, and the deformed first support element and the deformed second support element do not come into contact with each other.

5. The probe of claim 4, wherein when the first end portion and the second end portion of the probe are subjected to the force and the probe is compressed, the first support element and the second support element are deformed in a direction toward the axis.

6. The probe of claim 1, wherein the elastic units, the connecting units, the first end portion and the second end portion are formed as an integral unit.

7. The probe of claim 1, wherein when the probe is subjected to a lateral force of at least one guide plate, at least a part of the probe is displaced from the axis.

8. The probe of claim 7, wherein the at least a part of the probe comprises the first end portion, the second end portion, at least one of the elastic units or at least one of the connecting units.

9. An elastic structure of a probe, comprising:
a first section, connecting to an end portion;
a second section;
a connecting unit;
a first elastic unit, connected to the connecting unit, extending in a first direction from the connecting unit and connected to the first section, the first elastic unit comprising:
a first support portion and a second support portion, connecting the connecting unit to the first section; and
a second elastic unit, connected to the connecting unit, extending in a second direction from the connecting unit and connected to the second section, the second elastic unit comprising:
a third support portion and a fourth support portion, connecting the connecting unit to the second section;
wherein the first support portion and the second support portion are on opposite sides of an axis, a length of a line segment between the first support portion and the second support portion and perpendicular to the axis is less than a width of the connecting unit, the third support portion and the fourth support portion are on opposite sides of the axis, a length of a line segment between the third support portion and the fourth support portion and perpendicular to the axis is less than the width of the connecting unit, and the axis extends along a length of the probe;
wherein a width of the first section, a width of the second section and the width of the connecting unit are the same and are greater than a width of the end portion;
wherein when the probe is subjected to a force and is compressed, the first support portion and the second support portion are deformed in a direction away from the axis, and a length of a longest line segment between the deformed first support portion and the deformed second support portion and perpendicular to the axis is less than or equal to the width of the first section.

10. The elastic structure of claim 9, wherein when the probe is subjected to a force and is compressed, the first support portion, the second support portion, the third support portion and the fourth support portion are deformed; the length of a line segment formed between any point of the deformed first support portion and any point of the deformed second support portion and perpendicular to the first direction is less than or equal to a maximum width of the first section and the second section; and a length of a line segment formed between any point of the deformed third support portion and any point of the deformed fourth support portion and perpendicular to the second direction is less than or equal to the maximum width of the first section and the second section.

11. The elastic structure of claim 9, wherein the first section, the second section, the connecting unit, the first support portion, the second support portion, the third support portion and the fourth support portion are formed as an integral unit.

12. The elastic structure of claim 9, wherein the length of the line segment formed between any point of the first support portion and any point of the second support portion and perpendicular to the first direction is less than or equal to the maximum width of the first section and the second section; and the length of the line segment formed between any point of the third support portion and any point of the fourth support portion and perpendicular to the second direction is less than or equal to the maximum width of the first section and the second section.

13. The elastic structure of claim 9, wherein the axis is a centerline of the probe.

14. The elastic structure of claim 13, wherein the first support portion and the second support portion are arranged in a mirrored configuration on opposite sides of the axis, and the third support portion and the fourth support portion are arranged in a mirrored configuration on opposite sides of the axis.

15. The elastic structure of claim 9, wherein the first support portion and the third support portion are arranged in a mirrored configuration on opposite sides of the connecting unit, and the second support portion and the fourth support portion are arranged in a mirrored configuration on opposite sides of the connecting unit.

\* \* \* \* \*